(12) United States Patent
Park et al.

(10) Patent No.: US 10,347,853 B2
(45) Date of Patent: Jul. 9, 2019

(54) DISPLAY DEVICE HAVING FRACTURE RESISTANCE

(71) Applicant: Samsung Display Co., Ltd., Yongin-si (KR)

(72) Inventors: Yong-hwan Park, Cheonan-si (KR); Seongjun Lee, Seoul (KR); Jongseok Kim, Yongin-si (KR); Eunae Jung, Hwaseong-si (KR); Changyong Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/654,485

(22) Filed: Jul. 19, 2017

(65) Prior Publication Data

US 2018/0033980 A1    Feb. 1, 2018

(30) Foreign Application Priority Data

Jul. 29, 2016   (KR) .................. 10-2016-0097459

(51) Int. Cl.
*H01L 51/52* (2006.01)
*G06F 3/041* (2006.01)
(Continued)

(52) U.S. Cl.
CPC .......... *H01L 51/0533* (2013.01); *G06F 3/044* (2013.01); *G06F 3/0412* (2013.01);
(Continued)

(58) Field of Classification Search
CPC ............. H01L 51/5237; H01L 51/5056; H01L 27/3274; H01L 27/124; H01L 27/3248;
(Continued)

(56) References Cited

U.S. PATENT DOCUMENTS 9,525,012 B2   12/2016   Lim et al.
2010/0258346 A1   10/2010   Chen et al.
(Continued)

FOREIGN PATENT DOCUMENTS

EP        3217265         9/2017
KR    10-1453880        10/2014
(Continued)

OTHER PUBLICATIONS

Extended European Search Report dated Dec. 6, 2017, issued in the European Patent Application No. 17182912.0.
(Continued)

*Primary Examiner* — Marcos D. Pizarro
*Assistant Examiner* — Nelson Garces
(74) *Attorney, Agent, or Firm* — H.C. Park & Associates, PLC

(57) ABSTRACT

A display device including a base member, a circuit layer, a display layer, a thin film encapsulation layer, and a touch sensor layer. The base member includes a first area and a second area disposed adjacent to the first area. The circuit layer is disposed on the base member to cover the first area and to expose the second area. The display layer is disposed on the circuit layer to display an image. The thin film encapsulation layer is disposed on the display layer. The touch sensor layer is disposed on the thin film encapsulation layer and includes an organic layer extending from an upper portion of the thin film encapsulation layer to cover at least a portion of the exposed second area.

19 Claims, 30 Drawing Sheets

(51) Int. Cl.

| | |
|---|---|
| *H01L 51/10* | (2006.01) |
| *H01L 29/94* | (2006.01) |
| *H01L 21/8246* | (2006.01) |
| *H01L 21/00* | (2006.01) |
| *H01L 21/8234* | (2006.01) |
| *H01L 21/8242* | (2006.01) |
| *H01L 21/20* | (2006.01) |
| *H01L 29/78* | (2006.01) |
| *H01L 51/05* | (2006.01) |
| *H01L 51/00* | (2006.01) |
| *G06F 3/044* | (2006.01) |
| *H01L 27/32* | (2006.01) |
| *G02F 1/1362* | (2006.01) |

(52) U.S. Cl.
CPC .......... *G06F 3/0416* (2013.01); *H01L 27/323* (2013.01); *H01L 51/0023* (2013.01); *H01L 51/107* (2013.01); *H01L 51/5253* (2013.01); *G02F 1/136286* (2013.01); *G06F 2203/04102* (2013.01); *G06F 2203/04103* (2013.01); *G06F 2203/04111* (2013.01); *H01L 27/3262* (2013.01); *H01L 2251/5338* (2013.01)

(58) Field of Classification Search
CPC ........................ H01L 27/1214–27/1296; H01L 27/3244–27/3279; H01L 27/323; H01L 27/3237; H01L 27/3241; H01L 27/3246; H01L 27/3258; H01L 27/326; H01L 27/3262; H01L 27/3281; H01L 27/3283; H01L 27/3295; H01L 51/5253–51/5256; H01L 27/3234; H01L 27/3239; H01L 27/3255; H01L 27/3276; H01L 27/3288; H01L 2251/5338; H01L 51/107; H01L 51/0023; B32B 2457/206; G06F 3/044; G06F 3/0416; G06F 3/0412; G06F 2203/04102; G06F 2203/04103; G06F 2203/04111; G02F 1/136286

See application file for complete search history.

(56) References Cited

U.S. PATENT DOCUMENTS

| | | |
|---|---|---|
| 2014/0232956 A1 | 8/2014 | Kwon et al. |
| 2014/0319474 A1 | 10/2014 | Kim et al. |
| 2015/0041772 A1 | 2/2015 | Han |
| 2016/0093827 A1* | 3/2016 | Han .................... H01L 51/5246 257/40 |
| 2016/0103537 A1 | 4/2016 | Park et al. |
| 2017/0262109 A1 | 9/2017 | Choi et al. |

FOREIGN PATENT DOCUMENTS

| | | |
|---|---|---|
| KR | 1020140118955 | 10/2014 |
| KR | 1020150065554 | 6/2015 |
| KR | 1020150078504 | 7/2015 |
| KR | 10-2016-0080289 | 7/2016 |

OTHER PUBLICATIONS

Extended European Search Report dated May 10, 2019, issued in the European Patent Application No. 19162414,7.

* cited by examiner

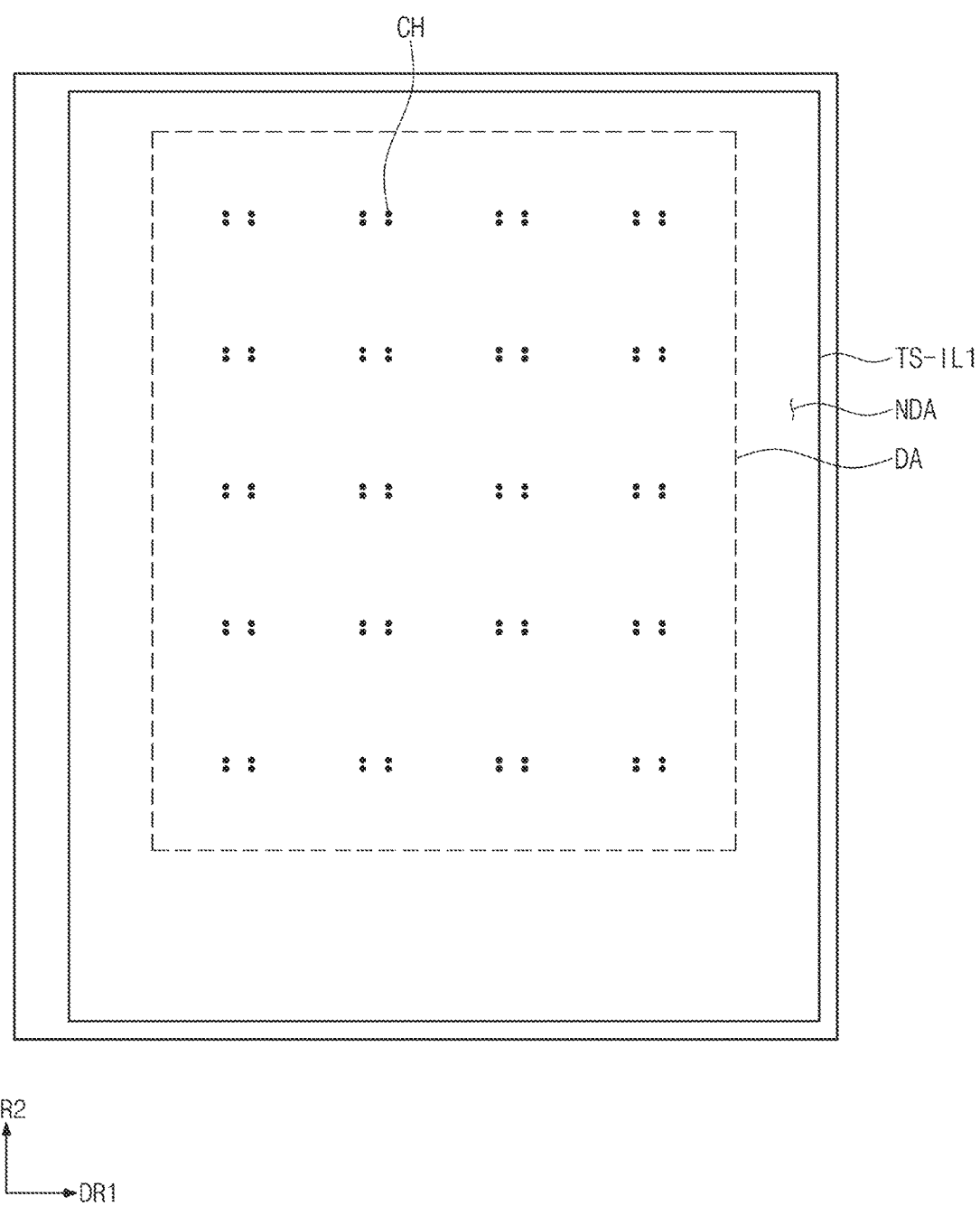

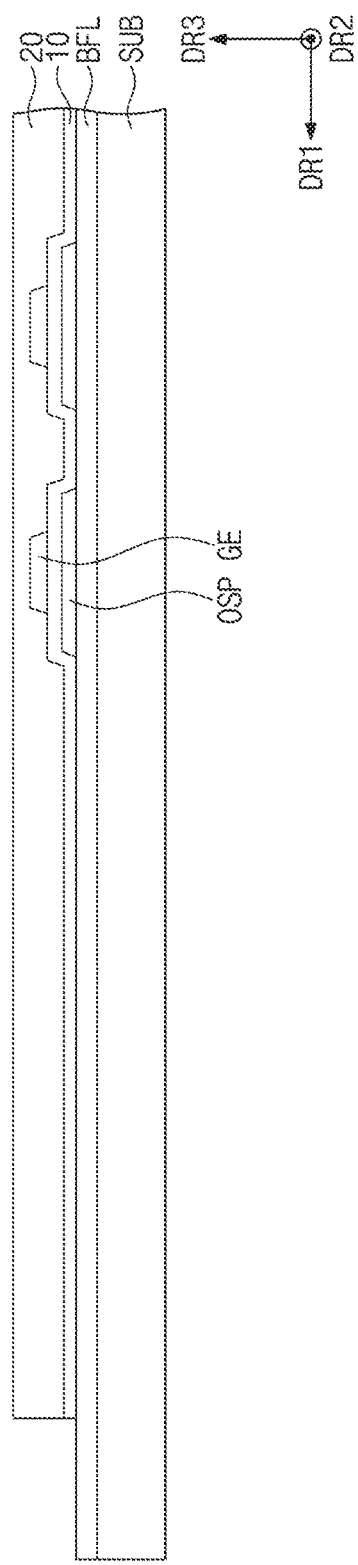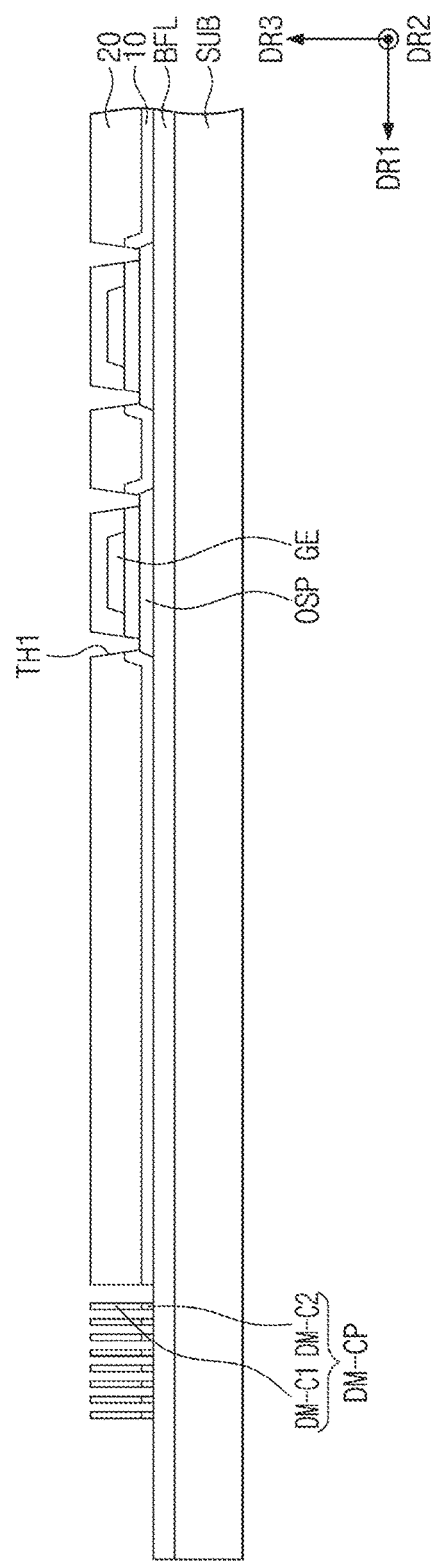

DISPLAY DEVICE HAVING FRACTURE RESISTANCE

CROSS-REFERENCE TO RELATED APPLICATION

This application claims priority from and the benefit of Korean Patent Application No. 10-2016-0097459, filed on Jul. 29, 2016, which is hereby incorporated by reference for all purposes as if fully set forth herein.

BACKGROUND

Field

Exemplary embodiments relate to a display device. More particularly, the present disclosure relates to a display device capable of preventing or reducing the occurrence of fractures in the device.

Discussion of the Background

Various display devices for a multimedia device, such as a television set, a mobile phone, a tablet computer, a navigation unit, a game unit, etc., have been developed. As an input device for the display devices, a keyboard or a mouse is widely used. In recent years, a touch panel is often used as the input device of the display devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of preventing fractures from occurring when the display device is bent or folded.

Additional aspects will be set forth in the detailed description which follows, and, in part, will be apparent from the disclosure, or may be learned by practice of the inventive concept.

An exemplary embodiment of the present invention discloses a display device including a base member, a circuit layer, a display layer, a thin film encapsulation layer, and a touch sensor layer. The base member includes a first area and a second area disposed adjacent to the first area. The circuit layer is disposed on the base member to cover the first area and to expose the second area. The display layer is disposed on the circuit layer to display an image. The thin film encapsulation layer is disposed on the display layer. The touch sensor layer is disposed on the thin film encapsulation layer and includes an organic layer extending from an upper portion of the thin film encapsulation layer to cover at least a portion of the exposed is second area.

According to the above, fractures in the display device may be prevented when the device is bent or folded.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 7B, FIG. 7C, FIG. 7D, and FIG. 7E are plan views showing a touch sensor layer according to an exemplary embodiment of the present disclosure.

FIG. 9A, FIG. 9B, FIG. 9C, FIG. 9D, FIG. 9E, FIG. 9F, FIG. 9G, FIG. 9H, and FIG. 9I are cross-sectional views showing a method of manufacturing a display module shown in FIG. 8C.

DETAILED DESCRIPTION OF THE ILLUSTRATED EMBODIMENTS

Figure 1A:
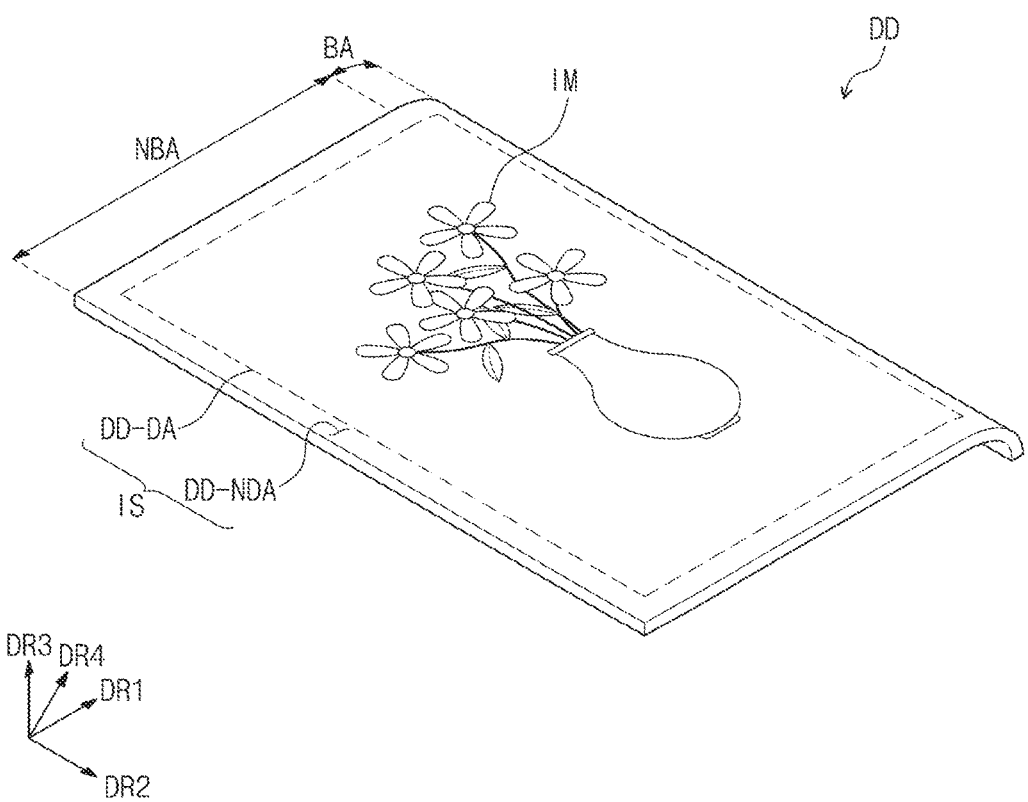
FIG. 1A is a perspective view showing a display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms, used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the present invention will be explained in detail with reference to the accompanying drawings.

FIG. 1A is a perspective view showing a display device DD according to an exemplary embodiment of the present disclosure.

Referring to FIG. 1A, the display device DD includes a plurality of areas. The display device DD includes a display area DD-DA in which an image IM is displayed and a non-display area DD-NDA disposed adjacent to the display area DD-DA. The image IM is not displayed in the non-display area DD-NDA. FIG. 1 shows an image of a vase as the image IM. The display area DD-DA has, for example, a substantially quadrangular shape, and the non-display area DD-NDA surrounds the display area DD-DA, but the present invention is not limited thereto or thereby.

The display device DD has a shape in which a portion thereof is bent. For instance, as shown in FIG. 1A, the display device DD includes a bending area BA having a bent shape and a non-bending area NBA having a flat shape. The bending area BA is disposed adjacent to at least one side of the non-bending area NBA. According to another exemplary embodiment, the bending area BA and the non-bending area NBA may be omitted.

The non-bending area NBA is substantially parallel to a surface defined by a first direction DR1 and a second direction DR2. A direction normal to the non-bending area NBA indicates a third direction DR3. In each member, a front surface is distinguished from a rear surface by the third direction DR3. The bending area BA bent from the non-bending area NBA displays the image IM to a fourth direction DR4 crossing the first direction DR1, the second direction DR2, and the third direction DR3. However, directions indicated by the first to fourth directions DR1 to DR4 are terms which are relative to each other, and thus, the first to fourth directions DR1 to DR4 may be changed to other directions.

Figure 1B:
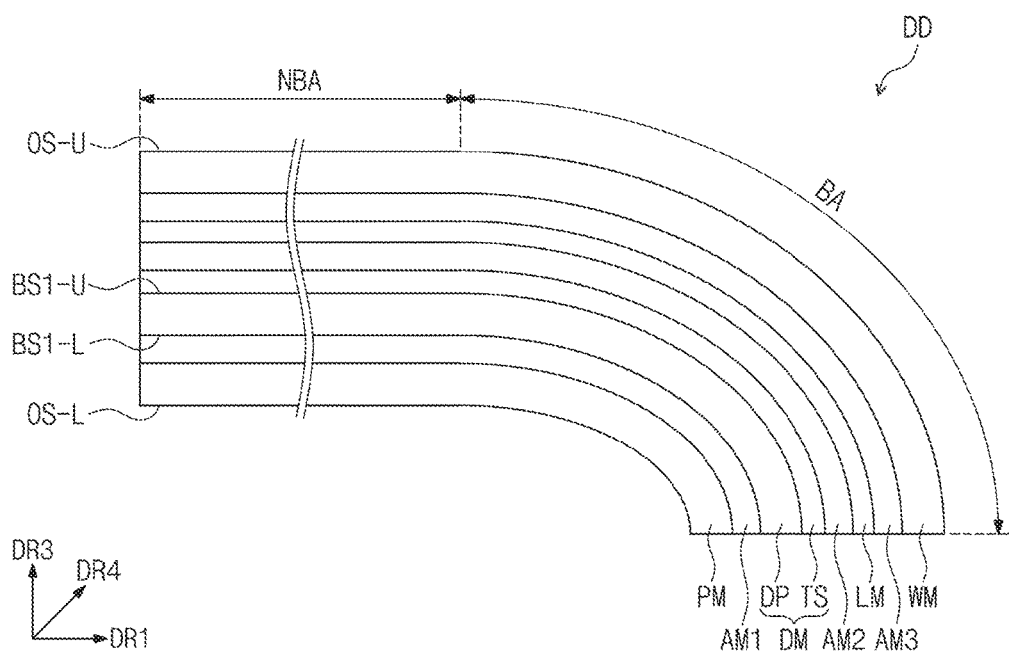
FIG. 1B is a cross-sectional view showing a display device according to an exemplary embodiment of the present disclosure.

FIG. 1B is a cross-sectional view showing the display device DD shown in FIG. 1A. FIG. 1B shows the cross-section defined by the first direction DR1 and the third direction DR3.

Referring to FIG. 1B, the display device DD includes a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 couples the display module DM and the protective film PM, the second adhesive member AM2 couples the display module DM and the optical member LM, and the third adhesive member AM3 couples the optical member LM and the window WM.

The protective film PM protects the display module DM. The protective film PM includes a first outer surface OS-L exposed to the outside and an adhesive surface adhered to the first adhesive member AM1. The protective film PM prevents external moisture from entering the display module DM and absorbs external impacts.

The protective film PM may include a plastic film as a base substrate. The protective film PM may include the plastic film including one selected from the group consisting of polyethersulfone(PES), polyacrylate(PAR), polyetherimide(PEI), polyethylenenaphthalate(PEN), polyethyleneterephthalate(PET), polyphenylenesulfide(PPS), polyarylate, polyimide(PI), polycabonate(PC), poly(aryleneethersulfone), and a mixture thereof.

The material of the protective film PM may include a mixed material of an organic material and an inorganic material without being limited to the plastic resins. The protective film PM includes a porous organic layer and an inorganic material filled in the pores of the organic layer. The protective film PM may further include a functional layer formed in the plastic film. The functional layer includes a resin layer. The functional layer is formed by a coating method. In an exemplary embodiment, the protective film PM may be omitted.

The window WM protects the display module DM from external impacts and provides an input surface to a user. The window WM provides a second outer surface OS-U exposed to the outside and an adhesive surface adhered to the third adhesive member AM3. The display surface IS shown in FIG. 1A may be the second outer surface OS-U shown in FIG. 1B.

The window WM may include a plastic film. The window WM may have a multi-layer structure, which may include a glass substrate, a plastic film, or a plastic substrate. The window WM may further include a bezel pattern. The multi-layer structure of the window WM may be formed through consecutive processes or an adhesive process using an adhesive.

The optical member LM reduces a reflectance of an external light. The optical member LM includes at least a polarizing film. The optical member LM further includes a retardation film. In the present exemplary embodiment, the optical member LM may be omitted.

The display module DM includes an organic light emitting display panel DP and a touch sensor layer TS. The touch sensor layer TS is directly disposed on the organic light emitting display panel DP. In the following descriptions, the expression "a first component is directly disposed on a second component" means that the first and second components are formed through consecutive processes without being attached to each other by using a separate adhesive layer.

The organic light emitting display panel DP generates the image IM (refer to FIG. 1A) corresponding to image data input thereto. The organic light emitting display panel DP includes a first display panel surface BS1-L and a second display panel surface BS1-U facing the first display panel surface BS1-L in the thickness direction DR3. In the present exemplary embodiment, the organic light emitting display panel DP will be described as a representative example of the display panel, but the display panel should not be limited to the organic light emitting display panel.

The touch sensor layer TS obtains coordinates information of an external input. The touch sensor layer TS senses the external input in an electrostatic capacitive manner.

Although not shown in the figures, the display module DM according to the present exemplary embodiment may further include an anti-reflection layer. The anti-reflection layer may include a stack structure of a color filter or a conductive layer/an insulating layer/a conductive layer. The anti-reflection layer absorbs or polarizes the light from the outside thereof to reduce the reflectance of the external light. The anti-reflection layer may replace the function of the optical member LM.

Each of the first, second, and third adhesive members AM1, AM2, and AM3 may be, but not limited to, an organic adhesive layer, such as an optically clear adhesive film (OCA), an optically clear resin (OCR), or a pressure sensitive adhesive film (PSA). The organic adhesive layer may include a polyurethane-based adhesive material, a polyacryl-based adhesive material, a polyester-based adhesive material, a poly epoxy-based adhesive material, or a polyvinyl acetate-based adhesive material. Consequently, the organic adhesive layer may correspond to one organic layer.

Although not shown in figures, the display device DD may further include a frame structure supporting the functional layer to maintain the state shown in FIGS. 1A and 1B. The frame structure may have a joint structure or a hinge structure.

The bending area BA of the display device DD may have a shape bent at a predetermined radius of curvature. Alternatively, the bending area BA may have a shape bent such that the radius of curvature is reduced as a distance from the non-bending area NBA increases. However, the bending area BA may be bent at various radius of curvature.

In the present exemplary embodiment, at least one of the protective film PM, the adhesive members AM1, AM2, and AM3, the optical member LM, and the window WM may be omitted. The display device according to the present exemplary embodiment may include combinations of various members and should not be limited to a specific structure.

Figure 2A:
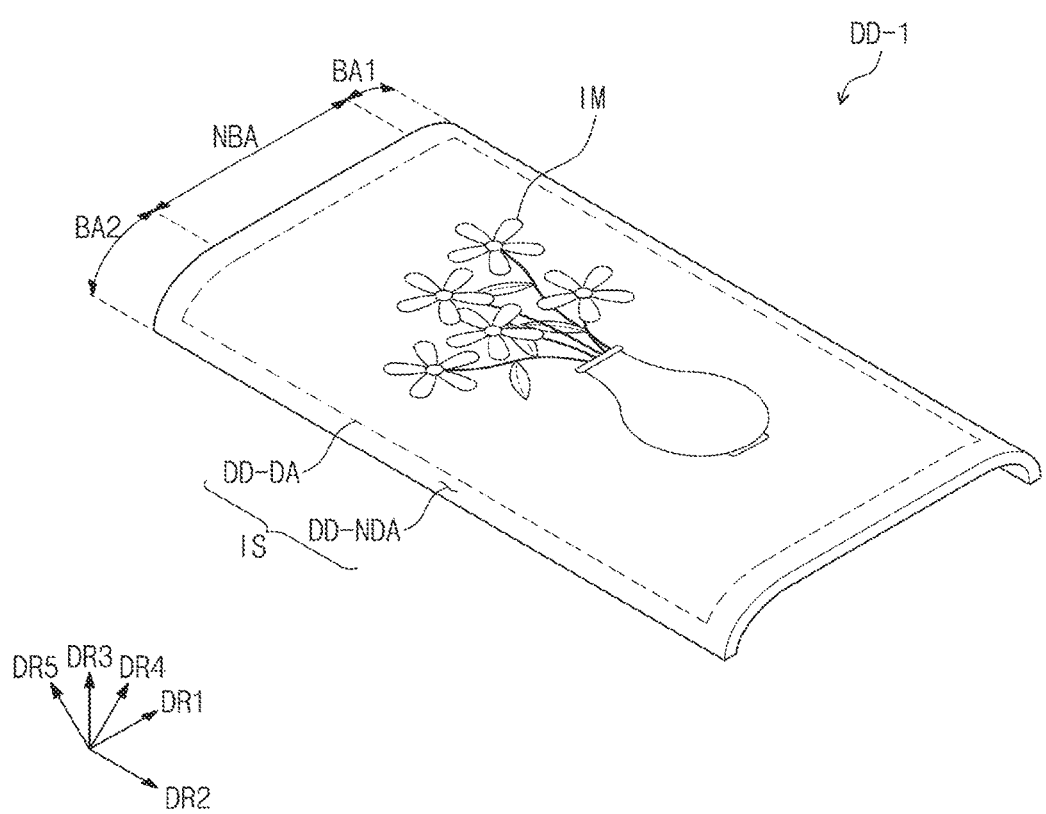
FIG. 2A is a perspective view showing a display device according to an exemplary embodiment of the present disclosure.
Figure 2B:
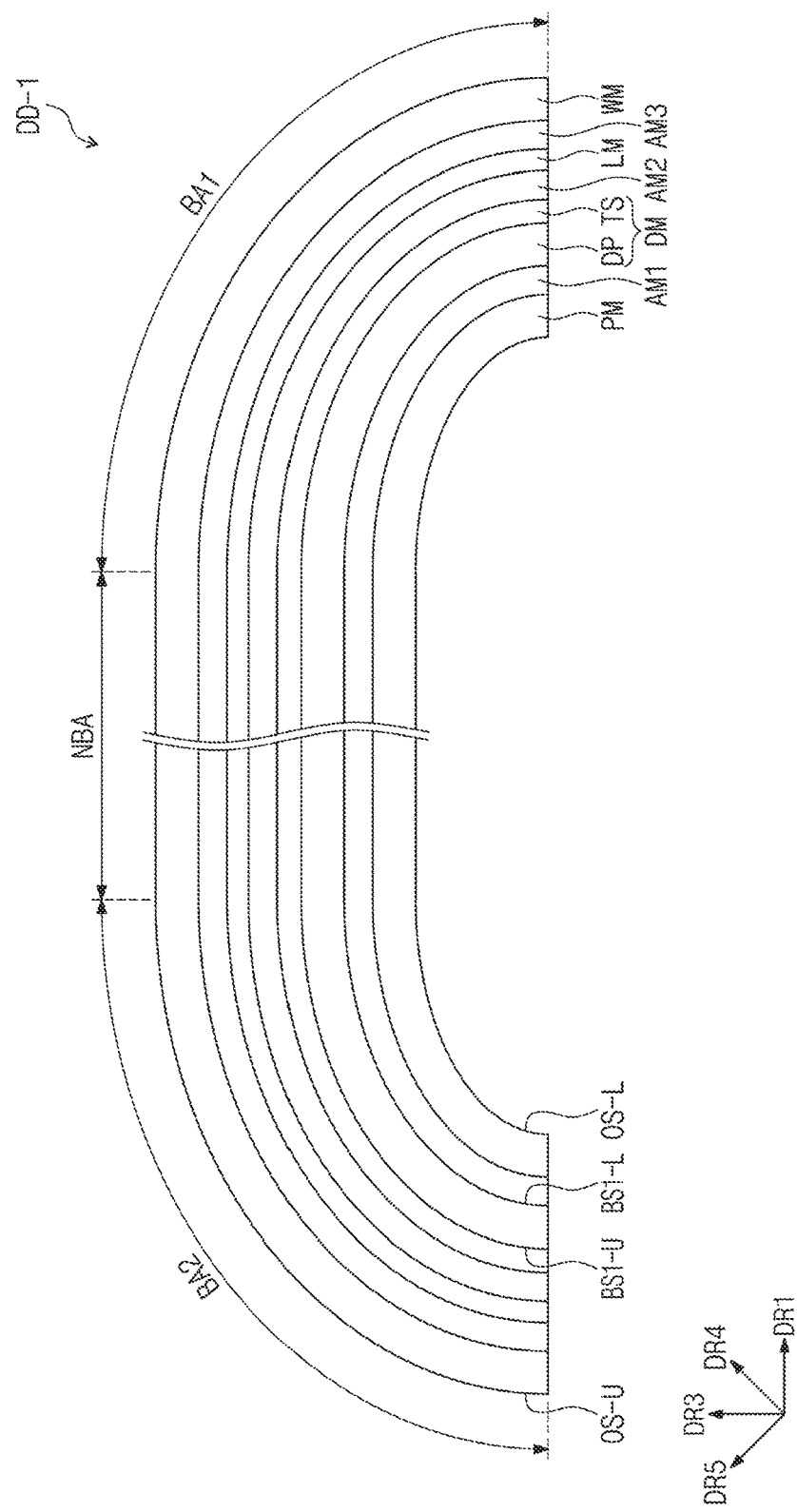
FIG. 2B is a cross-sectional view showing a display device according to an exemplary embodiment of the present disclosure.

FIG. 2A is a perspective view showing a display device DD-1 according to an exemplary embodiment of the present disclosure. FIG. 2B is a cross-sectional view showing the display device DD-1 according to an exemplary embodiment of the present disclosure. Hereinafter, the display device DD-1 will be described in detail with reference to FIGS. 2A and 2B. In FIGS. 2A and 2B, the same reference numerals denote the same elements in FIGS. 1A and 1B, and thus, detailed descriptions of the same elements will be omitted.

Referring to FIG. 2A, the display device DD-1 includes one non-bending area NBA, and first and second bending areas BA1 and BA2 disposed at opposite side surfaces of the non-bending area NBA. FIG. 2B shows the cross-section defined by the first and third directions DR1 and DR3.

The display device DD-1 includes the first bending area BA1 and the second bending area BA2. The first and second bending areas BA1 and BA2 are defined to be spaced apart from each other such that the non-bending area NBA is disposed between the first and second bending areas BA1 and BA2. The first bending area BA1 is disposed adjacent to one side of the non-bending area NBA and is bent to be convex toward the fourth direction DR4. The second bending area BA2 is disposed adjacent to the other side of the non-bending area NBA and is bent to be convex toward the fifth direction DR5.

The display device DD-1 has a substantially convex shape toward the third direction DR3. Meanwhile, the display device DD-1 may have a concave shape upward in accordance with the shape of each of the first and second bending areas BA1 and BA2 according to exemplary embodiments. The display device DD-1 according to the present exemplary embodiment may have various shapes and should not be limited to a specific embodiment.

Although FIGS. 1A to 2B show a bending display device as a representative example of the display devices DD and DD-1, the display devices DD and DD-1 may be a foldable display device or a rollable display device. In addition, the present exemplary embodiment shows the flexible display device, but it should not be limited thereto or thereby. That is, the display device DD according to the present exemplary embodiment may be a flat rigid display device or a curved rigid display device. The display device DD according to the present exemplary embodiment may be applied to a large-sized electronic item, such as a television set, a monitor, etc., and a small and medium-sized electronic item, such as a mobile phone, a tablet, automobile navigation, a game unit, a smart watch, etc.

Figure 3A:
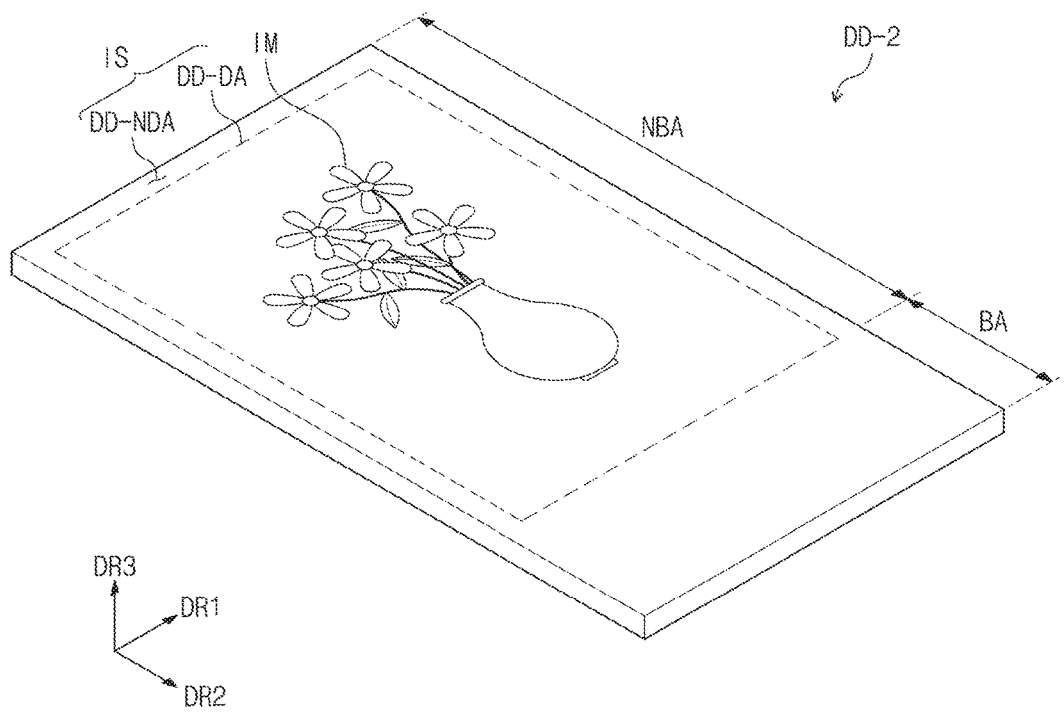
FIG. 3A and FIG. 3B are perspective views showing a display device according to an exemplary embodiment of the present disclosure.
Figure 3B:
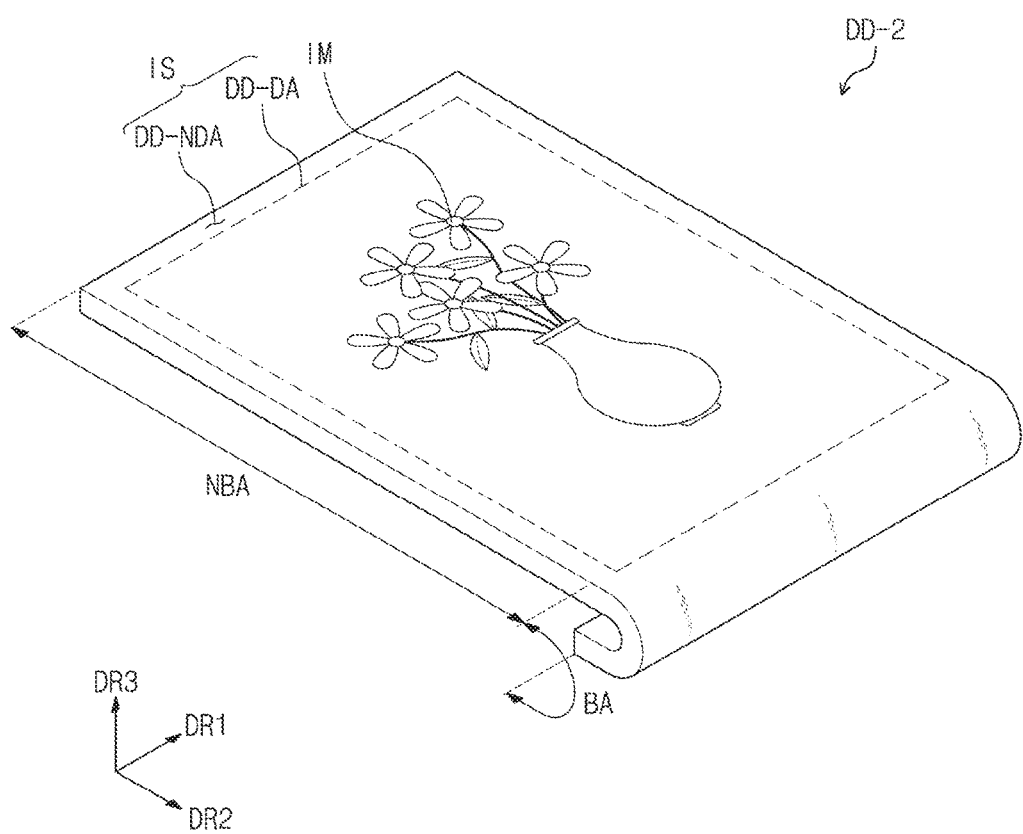

FIGS. 3A and 3B are perspective views showing a display device DD-2 according to an exemplary embodiment of the present disclosure. FIG. 3A shows the display device DD-2 in an unfolded state, and FIG. 3B shows the display device DD-2 in a bent state.

The display device DD-2 includes one bending area BA and one non-bending area NBA. The non-display area DD-NDA of the display device DD-2 is bent. However, the bent area of the display device DD-2 may be changed in the present exemplary embodiment.

The display device DD-2 may be fixed in one state while being operated. The display device DD-2 may be operated in the bent state as shown in FIG. 3B. The display device DD-2 may be fixed to a frame while being bent, and the frame may be coupled to a housing of an electronic device.

The display device DD-2 according to the present exemplary embodiment may have substantially the same cross-sectional structure as that shown in FIG. 1B. However, the non-bending area NBA and the bending area BA may have different stack structures from each other. For instance, the non-bending area NBA may have substantially the same cross-sectional structure as that shown in FIG. 1B, and the bending area BA may have a cross-sectional structure different from that shown in FIG. 1B. The optical member LM and the window WM may not be disposed in the bending area BA. That is, the optical member LM and the window WM may be disposed only in the non-bending area NBA. The second and third adhesive members AM2 and AM3 may not be disposed in the bending area BA. As described above, since at least one element among elements shown in FIG. 1B may be overlapped with only the non-bending area NBA and may not be overlapped with the bending area BA, the bending area BA may have a relatively small thickness when compared to that of the non-bending area NBA. Accordingly, the bending area may be easily bent.

Figure 4A:
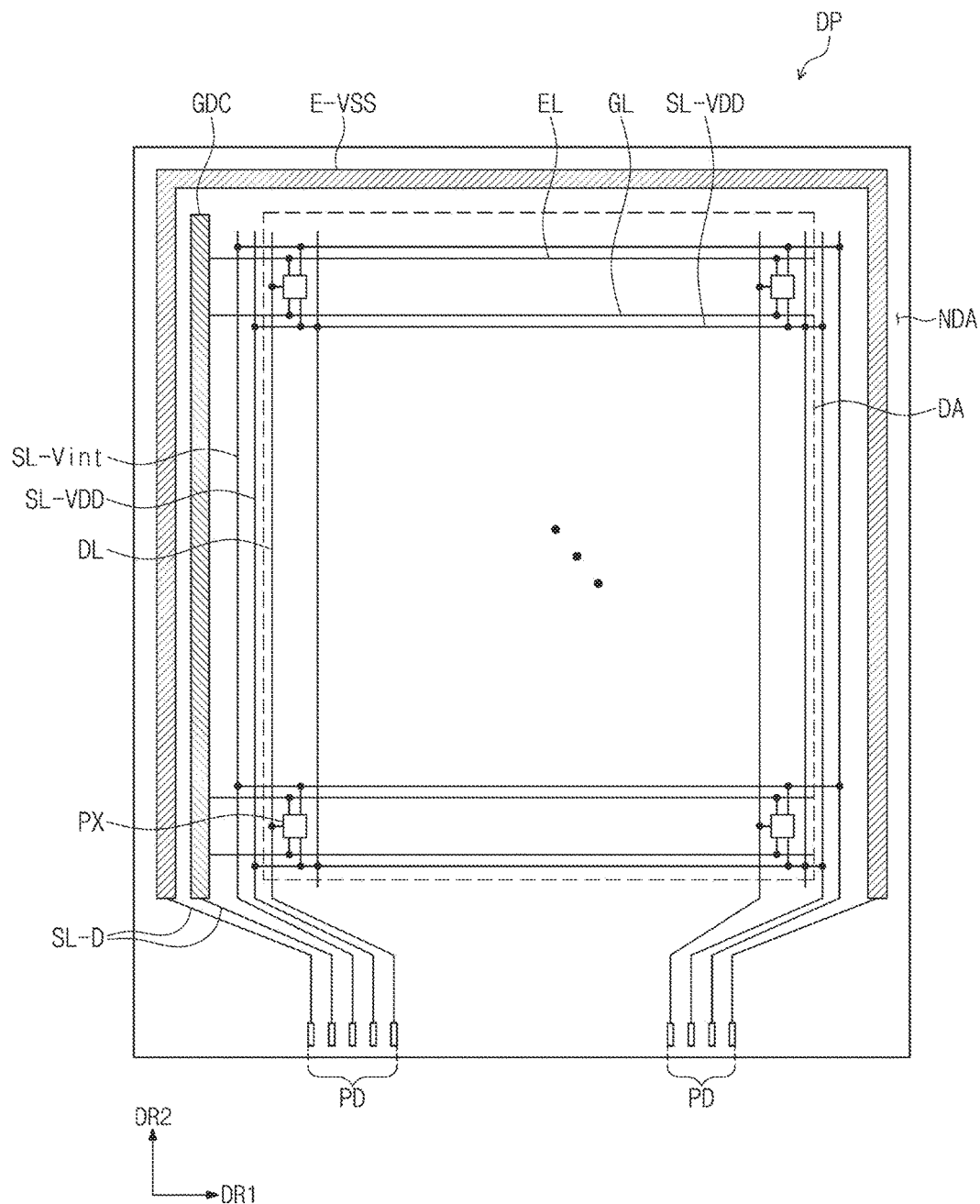
FIG. 4A is a plan view showing an organic light emitting display panel according to an exemplary embodiment of the present disclosure.
Figure 4B:
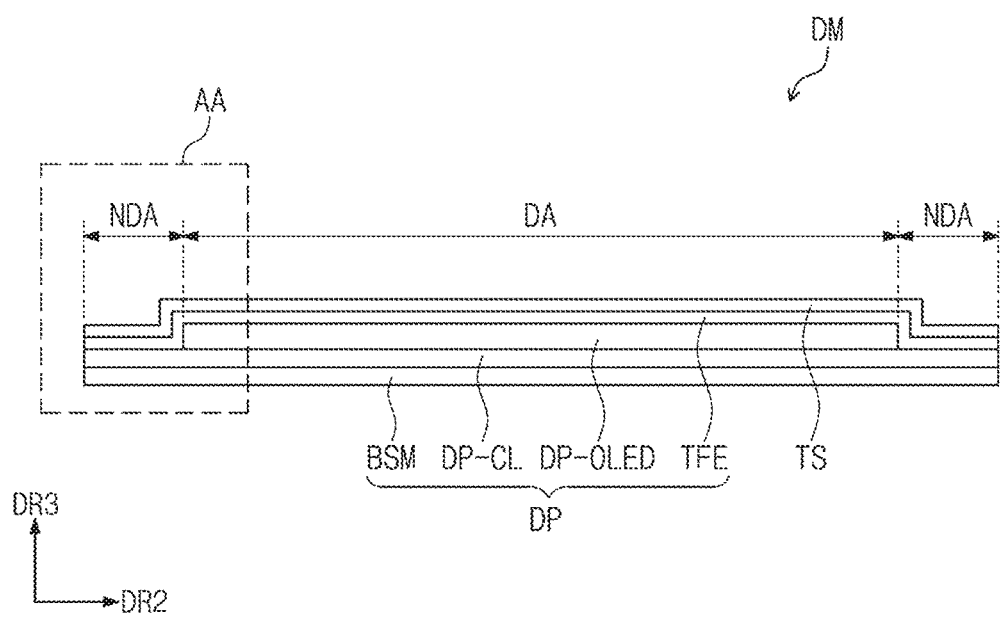
FIG. 4B is a cross-sectional view showing a display module according to an exemplary embodiment of the present disclosure.

FIG. 4A is a plan view showing an organic light emitting display panel DP according to an exemplary embodiment of the present disclosure, and FIG. 4B is a cross-sectional view showing a display module DM according to an exemplary embodiment of the present disclosure.

Referring to FIG. 4A, the organic light emitting display panel DP includes a display area DA and a non-display area NDA when viewed in a plan view. The display area DA and the non-display area NBA of the organic light emitting display panel DP respectively correspond to the display area DD-DA (refer to FIG. 1A) and the non-display area DD-NDA (refer to FIG. 1A) of the display device DD (refer to FIG. 1A). The display area DA and the non-display area NDA of the organic light emitting display panel DP are not required to be identical to the display area DD-DA (refer to FIG. 1A) and the non-display area DD-NDA (refer to FIG. 1A) of the display device DD (refer to FIG. 1A), and the display area DA and the non-display area NDA of the organic light emitting display panel DP may be changed in accordance with the structure and design of the organic light emitting display panel DP.

The organic light emitting display panel DP includes a plurality of pixels PX. An area in which the pixels PX are arranged is referred to as the display area DA. In the present exemplary embodiment, the non-display area NDA is defined along an edge of the display area DA.

The organic light emitting display panel DP includes gate lines GL, data lines DL, light emitting lines EL, a control signal line SL-D, an initialization voltage line SL-Vint, a voltage line SL-VDD, a power supply line E-VSS, and a pad part PD.

Each of the gate lines GL is connected to a corresponding pixel of the pixels PX, and each of the data lines DL is connected to a corresponding pixel of the pixels PX. Each of the light emitting lines EL is arranged to be substantially parallel to a corresponding gate line of the gate lines GL. The control signal line SL-D applies a control signal to a gate driving circuit GDC. The initialization voltage line SL-Vint applies an initialization voltage to the pixels PX. The voltage line SL-VDD is connected to the pixels PX to apply a first voltage to the pixels PX. The voltage line SL-VDD includes a plurality of lines extending in the first direction DR1 and a plurality of lines extending in the second direction DR2. The power supply line E-VSS is disposed in the non-display area NDA to surround three sides of the display area DA. The power supply line E-VSS applies a common voltage (e.g., a second voltage) to the pixels PX. The common voltage has a level lower than that of the first voltage.

The gate driving circuit GDC is disposed at one side portion of the non-display area NDA and connected to the gate lines GL and the light emitting lines EL. Some of the gate lines GL, the data lines DL, the light emitting lines EL, the control signal line SL-D, the initialization voltage line SL-Vint, and the voltage line SL-VDD are disposed on the same layer, and the others of the gate lines GL, the data lines DL, the light emitting lines EL, the control signal line SL-D, the initialization voltage line SL-Vint, and the voltage line SL-VDD are disposed on different layers.

The pad part PD is connected to an end of the data lines DL, the control signal line SL-D, the initialization voltage line SL-Vint, and the voltage line SL-VDD.

Referring to FIG. 4B, the organic light emitting display panel DP includes a base member BSM, a circuit layer DP-CL disposed on the base member BSM, a display layer DP-OLED, and a thin film encapsulation layer TFE.

The base member BSM includes at least one plastic film. The base member BSM may be a flexible substrate and may include a plastic substrate, a glass substrate, a metal substrate, or an organic/inorganic-mixed material substrate. The plastic substrate includes at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The circuit layer DP-CL includes a plurality of insulating layers, a plurality of conductive layers, and a semiconductor layer. The conductive layers of the circuit layer DP-CL may form signal lines or a control circuit of the pixel.

The display layer DP-OLED includes a plurality of organic light emitting diodes.

The thin film encapsulation layer TFE encapsulates the display layer DP-OLED. The thin film encapsulation layer TFE includes an inorganic layer and an organic layer. The thin film encapsulation layer TFE includes at least two inorganic layers and an organic layer disposed between them. The inorganic layers protect the display layer DP-OLED from moisture and oxygen, and the organic layer protects the display layer DP-OLED from foreign substance, such as dust. The inorganic layer may include a silicon nitride layer, a silicon oxynitride layer, and a silicon oxide layer. The organic layer may include an acryl-based organic material, but it should not be limited thereto or thereby.

The touch sensor layer TS is directly disposed on the thin film encapsulation layer TFE. The touch sensor layer TS includes touch sensors and touch signal lines. The touch sensors and the touch signal lines have a singly-layer structure or a multi-layer structure.

The touch sensors and the touch signal lines may include indium tin oxide (ITO), indium zinc oxide (IZO), zinc oxide (ZnO), indium tin zinc oxide (ITZO), PEDOT, a metal nano-wire, and a graphene. The touch sensors and the touch signal lines may include a metal layer, e.g., molybdenum, silver, titanium, copper, aluminum, or an alloy thereof. The touch sensors and the touch signal lines may have the same layer structure or different layer structures. The touch sensor layer TS will be described in detail later.

Figure 5A:
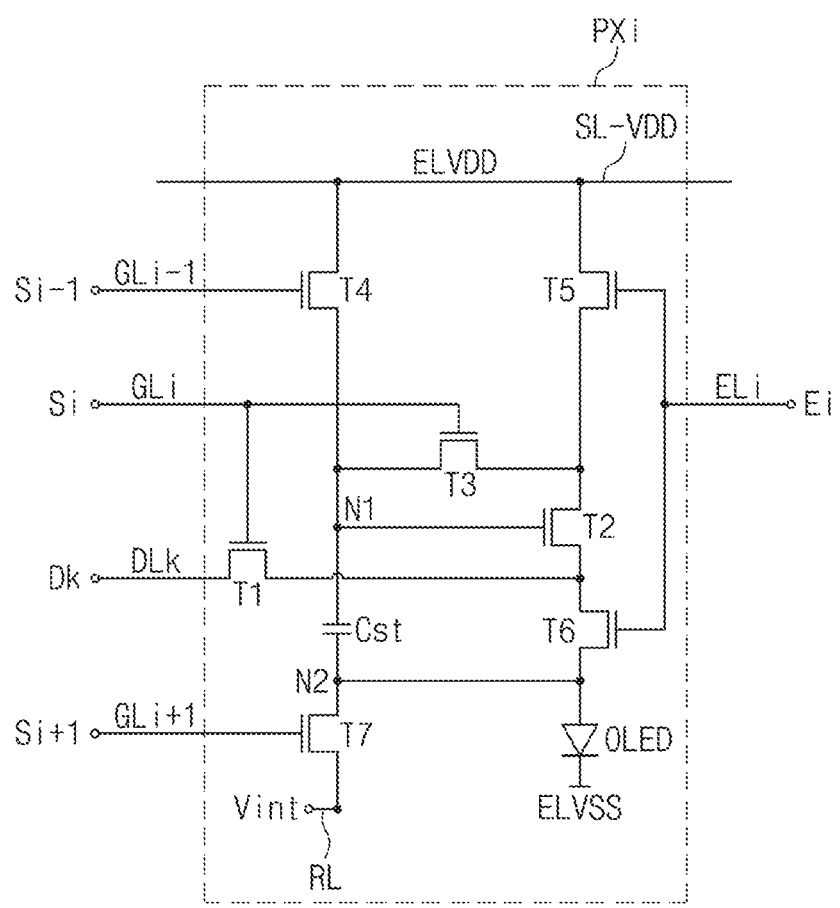
FIG. 5A is an equivalent circuit diagram showing a pixel according to an exemplary embodiment of the present disclosure.

FIG. 5A is an equivalent circuit diagram showing a pixel according to an exemplary embodiment of the present disclosure.

FIG. 5A shows an i-th pixel PXi connected to a k-th data line DLk among the data lines DL (refer to FIG. 4A).

The i-th pixel PXi includes an organic light emitting diode OLED and a pixel driving circuit controlling the organic light emitting diode OLED. The pixel driving circuit includes seven thin film transistors T1 to T7 and one storage capacitor Cst. The driving thin film transistor T1 controls a driving current applied to the organic light emitting diode OLED. An output electrode of a second thin film transistor T2 is electrically connected to the organic light emitting diode OLED. The output electrode of the second thin film transistor T2 directly contacts a first electrode of the organic light emitting diode OLED or is connected to the first electrode of the organic light emitting diode OLED via another transistor, e.g., a sixth thin film transistor T6.

A control electrode of a control transistor receives a control signal. The control signal applied to the i-th pixel PXi includes an (i−1)th gate signal Si−1, an i-th gate signal Si, an is (i+1)th gate signal Si+1, a data signal Dk, and an i-th light emitting control signal Ei. In the present exemplary embodiment, the control thin film transistor includes a first thin film transistor T1 and third to seventh thin film transistors T3 to T7.

The first thin film transistor T1 includes an input electrode connected to the k-th data line DLk, a control electrode connected to an i-th gate line GLi, and an output electrode connected to the output electrode of the second thin film transistor T2. The first thin film transistor T1 is turned on by the gate signal Si (hereinafter, referred to as the "i-th gate signal") applied to the i-th gate line GLi to apply the data signal Dk applied to the k-th data line to the storage capacitor Cst.

Figure 5B:
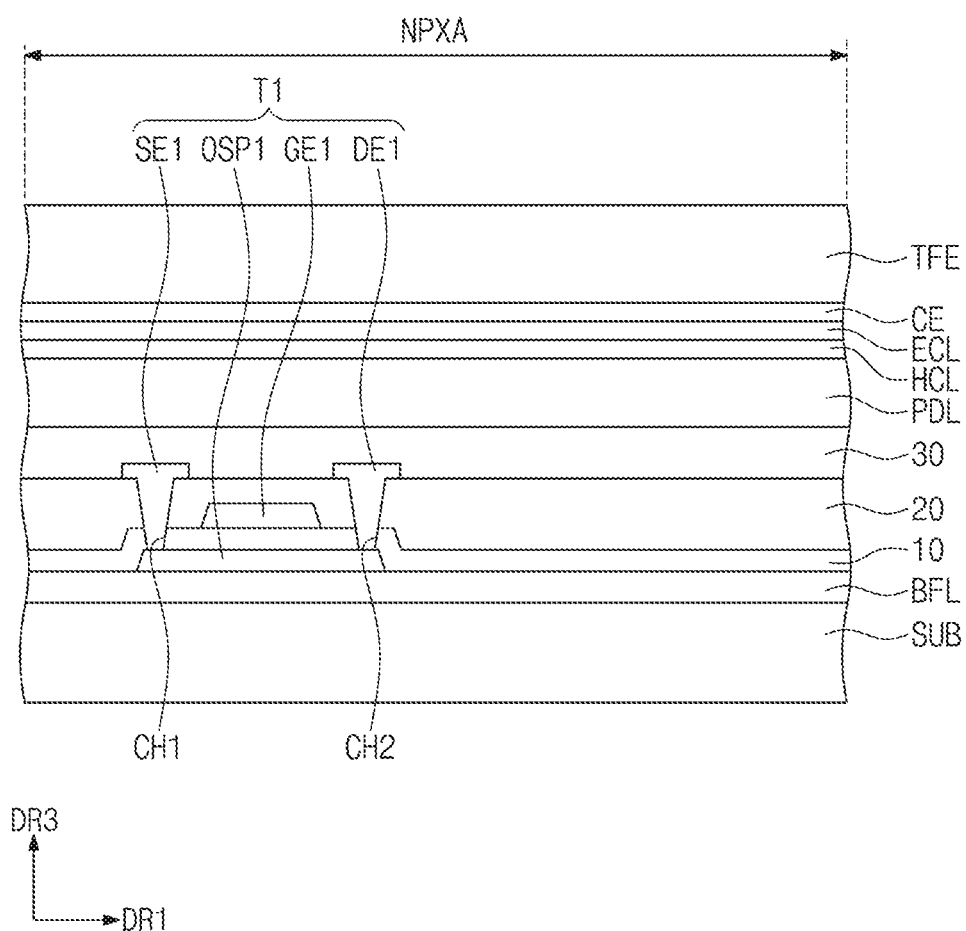
FIG. 5B is a cross-sectional view showing a portion of an organic light emitting display panel according to an exemplary embodiment of the present disclosure.
Figure 5C:
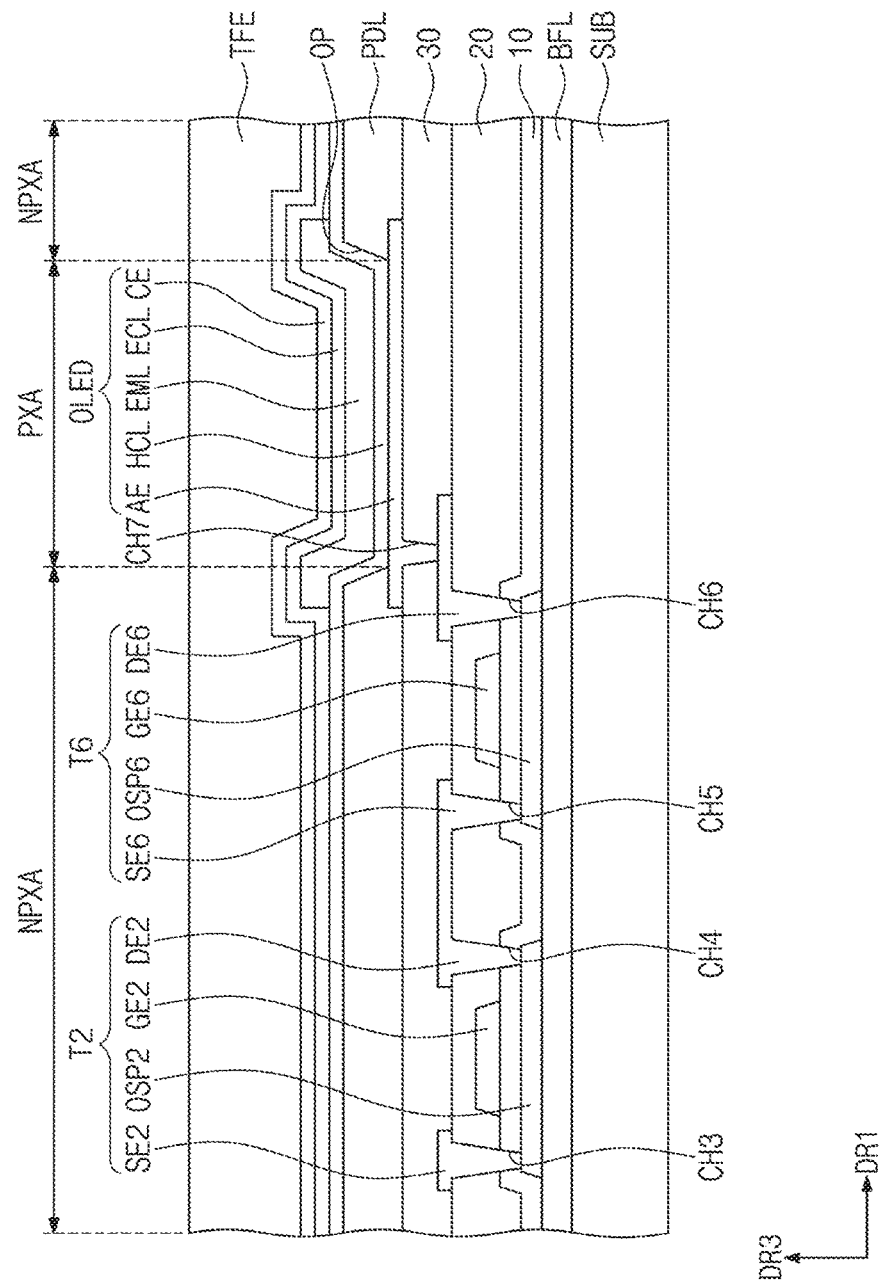
FIG. 5C is a cross-sectional view showing a portion of an organic light emitting display panel according to an exemplary embodiment of the present disclosure.

FIG. 5B is a cross-sectional view showing a portion of an organic light emitting display panel according to an exemplary embodiment of the present disclosure, and FIG. 5C is a cross-sectional view showing a portion of an organic light emitting display panel according to an exemplary embodiment of the present disclosure. In detail, FIG. 5B shows the cross-section of the portion corresponding to the first thin film transistor T1 of the equivalent circuit shown in FIG. 5A, and FIG. 5C shows the cross-section of the portion corresponding to the second thin film transistor T2, the sixth thin film transistor T6, and the organic light emitting diode OLED of the equivalent circuit shown in FIG. 5A.

Referring to FIGS. 5B and 5C, a buffer layer BFL is disposed on the base layer SUB. The buffer layer BFL improves a coupling force between the base layer SUB and the conductive patterns or the semiconductor patterns. The buffer layer BFL includes an inorganic layer. Although not shown in the figures, a barrier layer may be further disposed on the base layer SUB to prevent foreign substances from entering. The buffer layer BFL and the barrier layer may be selectively disposed or omitted.

A semiconductor pattern OSP1 (hereinafter, referred to as a "first semiconductor pattern") of the first thin film transistor T1, a semiconductor pattern OSP2 (hereinafter, referred to as a "second semiconductor pattern") of the second thin film transistor T2, and a semiconductor patter OSP6 (hereinafter, referred to as a "sixth semiconductor pattern") of the sixth thin film transistor T6 are disposed on the buffer layer BFL. The first semiconductor pattern OSP1, the second semiconductor pattern OSP2, and the sixth semiconductor pattern OSP6 may include amorphous silicon, polysilicon, or metal oxide semiconductor.

A first insulating layer 10 is disposed on the first semiconductor pattern OSP1, the second semiconductor pattern OSP2, and the sixth semiconductor pattern OSP6. In FIGS. 5B and 5C, the first insulating layer 10 is provided in a layer form to cover the first semiconductor pattern OSP1, the second semiconductor pattern OSP2, and the sixth semiconductor pattern OSP6, but the present invention should not be limited thereto or thereby. That is, the first insulating layer 10 may be provided in pattern form corresponding to the first semiconductor pattern OSP1, the second semiconductor pattern OSP2, and the sixth semiconductor pattern OSP6.

The first insulating layer 10 may include a plurality of inorganic thin layers. The inorganic thin layers include the silicon nitride layer, the silicon oxynitride layer, and the silicon oxide layer.

A control electrode GE1 (hereinafter, referred to as a "first control electrode") of the first thin film transistor T1, a control electrode GE2 (hereinafter, referred to as a "second control electrode") of the second thin film transistor T2, a control electrode GE6 (hereinafter, referred to as a "sixth control electrode") of the sixth thin film transistor T6 are disposed on the first insulating layer 10. The first control electrode GE1, the second control electrode GE2, and the sixth control electrode GE6 are formed through the same photolithography process as the gate lines GL (refer to FIG. 4A).

A second insulating layer 20 is disposed above the first insulating layer 10 to cover the first control electrode GE1, the second control electrode GE2, and the sixth control electrode GE6. The second insulating layer 20 provides a flat upper surface. The second insulating layer 20 includes an organic material and/or an inorganic material.

An input electrode SE1 (hereinafter, referred to as a "first input electrode") and an output electrode DE1 (hereinafter, referred to as a "first output electrode") of the first thin film transistor T1, an input electrode SE2 (hereinafter, referred to as a "second input electrode") and an output electrode DE2 (hereinafter, referred to as a "second output electrode") of the second thin film transistor T2, and an input electrode SE6 (hereinafter, referred to as a "sixth input electrode") and an output electrode DE6 (hereinafter, referred to as a "sixth output electrode") of the sixth thin film transistor T6 are disposed on the second insulating layer 20.

The first input electrode SE1 and the first output electrode DE1 are connected to the first semiconductor pattern OSP1 respectively through a first contact hole CH1 and a second contact hole CH2, which are formed through the first and second insulating layers 10 and 20. The second input electrode SE2 and the second output electrode DE2 are connected to the second semiconductor pattern OSP2 respectively through a third contact hole CH3 and a fourth contact hole CH4, which are formed through the first and second insulating layers 10 and 20. The sixth input electrode SE6 and the sixth output electrode DE6 are connected to the sixth semiconductor pattern OSP6 respectively through a fifth contact hole CH5 and a sixth contact hole CH6, which are formed through the first and second insulating layers 10 and 20. Meanwhile, according to another exemplary embodiment, each of the first, second, and sixth thin film transistors T1, T2, and T6 may have a bottom gate structure.

A third insulating layer 30 is disposed above the second insulating layer 20 to cover the first input electrode SE1, the second input electrode SE2, the sixth input electrode SE6, the first output electrode DE1, the second output electrode DE2, and the sixth output electrode DE6. The third insulating layer 30 includes an organic layer and/or an inorganic layer. In particular, the third insulating layer 30 may include an organic material in order to provide a flat surface.

One of the first insulating layer 10, the second insulating layer 20, and the third insulating layer 30 may be omitted in accordance with the circuit structure of the pixel. Each of the second and third insulating layers 20 and 30 may be referred to as an interlayer. The interlayer is disposed between conductive patterns, e.g., upper and lower conductive patterns, to insulate the conductive patterns from each other.

The pixel definition layer PDL and the organic light emitting diode OLED are disposed on the third insulating layer 30. A first electrode AE is disposed on the third insulating layer 30. The first electrode AE is connected to the sixth output electrode DE6 through a seventh contact hole CH7 defined through the third insulating layer 30. The pixel definition layer PDL is provided with an opening OP defined therethrough. At least a portion of the first electrode AE is exposed through the opening OP of the pixel definition layer PDL.

The pixel PX is disposed in a pixel area when viewed in a plan view. The pixel area includes a light emitting area PXA and a non-light emitting area NPXA adjacent to the light emitting area PXA. The non-light emitting area NPXA surrounds the light emitting area PXA. In the present exemplary embodiment, the light emitting area PXA is defined to correspond to a portion of the first electrode AE exposed through the opening OP.

A hole control layer HCL is commonly disposed in the light emitting area PXA and the non-light emitting area NPXA. Although not shown in the figures, a common layer, such as the hole control layer HCL, may be commonly formed in the pixels PX (refer to FIG. 4A).

An organic light emitting layer EML is disposed on the hole control layer HCL. The organic light emitting layer EML is disposed in an area corresponding to the opening OP. That is, the organic light emitting layer EML may be patterned into a plurality of parts, and the parts may be respectively disposed in the pixels PX. In the present exemplary embodiment, the patterned organic light emitting layer EML is shown as a representative example, but the organic light emitting layer EML may be commonly disposed in the pixels PX. In this case, the organic light emitting layer EML may generate a white light. In addition, the organic light emitting layer EML may have a multi-layer structure.

An electron control layer ECL is disposed on the organic light emitting layer EML. Although not shown in the figures, the electron control layer ECL may be commonly disposed in the pixels PX (refer to FIG. 4A).

A second electrode CE is disposed on the electron control layer ECL. The second electrode CE is commonly disposed in the pixels PX.

The thin film encapsulation layer TFE is disposed on the second electrode CE. The thin film encapsulation layer TFE is commonly disposed in the pixels PX. The thin film encapsulation layer TFE includes at least one inorganic layer and at least one organic layer. The thin film encapsulation layer TFE may include a plurality of inorganic layers and a plurality of organic layers alternately stacked with the inorganic layers.

In the present exemplary embodiment, the thin film encapsulation layer TFE may directly cover the second electrode CE. In the present exemplary embodiment, a capping layer may be further disposed between the thin film encapsulation layer TFE and the second electrode CE to cover the second electrode CE. In this case, the thin film encapsulation layer TFE may directly cover the capping layer.

Figure 6A:
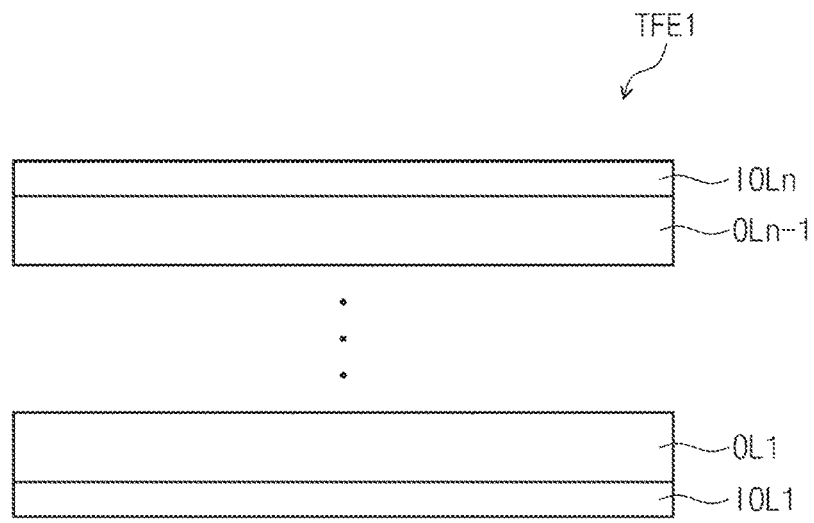
FIG. 6A, FIG. 6B, and FIG. 6C are cross-sectional views showing thin film encapsulation layers according to an exemplary embodiment of the present disclosure.
Figure 6B:
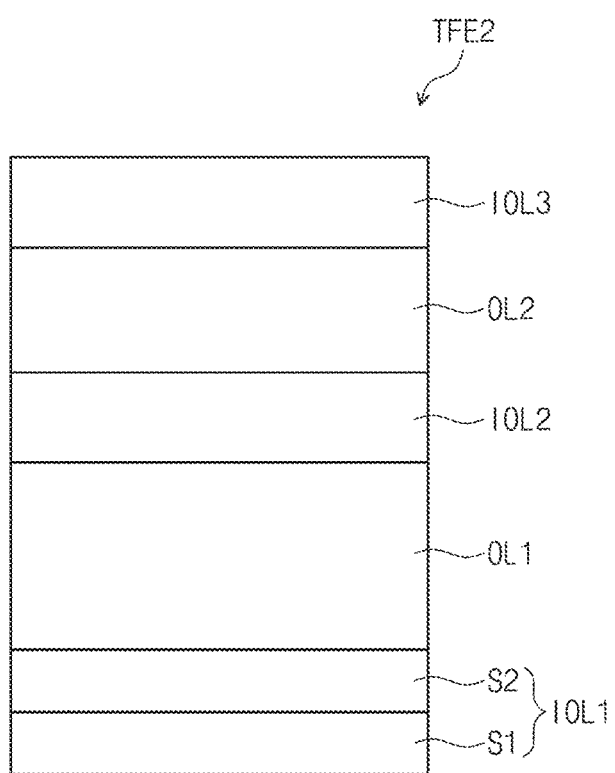
Figure 6C:
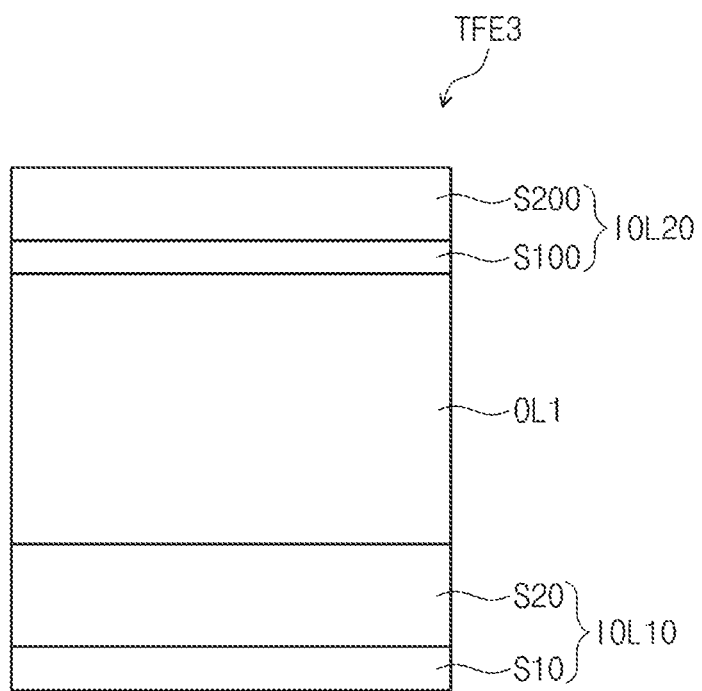

FIGS. 6A to 6C are cross-sectional views showing thin film encapsulation layers according to an exemplary embodiment of the present disclosure. Hereinafter, the thin film encapsulation layers TFE1, TFE2, and TFE3 according to the present disclosure will be described in detail with reference to FIGS. 6A to 6C.

Referring to FIG. 6A, the thin film encapsulation layer TFE1 includes n inorganic thin layers IOL1 to IOLn, and a first inorganic thin layer IOL1 among the n inorganic thin layers IOLn makes contact with the second electrode CE (refer to FIG. 6C). The first inorganic thin layer IOL1 may be referred to as a "lower inorganic thin layer", and the inorganic thin layers except for the first inorganic thin layer IOL1 among the n inorganic thin layers IOL1 to IOLn may be referred to as "upper inorganic thin layers".

The thin film encapsulation layer TFE1 includes n−1 organic thin layers OL1 to OLn−1, and the n−1 organic thin layers OL1 to OLn−1 are alternately arranged with the n inorganic thin layers IOL1 to IOLn. Each of the n−1 organic thin layers OL1 to OLn−1 may have a thickness greater than that of each of then inorganic thin layers IOL1 to IOLn.

Each of the n inorganic thin layers IOL1 to IOLn may have a single-layer structure containing one type of material or a multi-layer structure containing plural different types of material. Each of the n−1 organic thin layers OL1 to OLn-1 may be formed by depositing organic monomers. For instance, each of the n−1 organic thin layers OL1 to OLn−1 may be formed using an inkjet printing method or by coating a composition containing an acryl-based monomer. In the present exemplary embodiment, the thin film encapsulation layer TFE1 may further include an n-th organic thin layer.

Referring to FIGS. 6B and 6C, the inorganic thin layers included in each of the thin film encapsulation layers TFE2 and TFE3 may include the same inorganic material or different inorganic materials from each other and may have the same thickness or different thicknesses. The organic thin layers included in each of the thin film encapsulation layers TFE2 and TFE3 may include the same organic material or different organic materials from each other, and may have the same or different thicknesses.

As shown in FIG. 6B, the thin film encapsulation layer TFE2 includes the first inorganic thin layer IOL1, the first organic thin layer OL1, the second inorganic thin layer IOL2, the second organic thin layer OL2, and the third inorganic thin layer IOL3, which are sequentially stacked.

The first inorganic thin layer IOL1 may have a double-layer structure. A first sub-layer S1 and a second sub-layer S2 may have different inorganic materials.

As shown in FIG. 6C, the thin film encapsulation layer TFE2 includes a first inorganic thin layer IOL10, a first organic thin layer OL1, and a second inorganic thin layer IOL20, which are sequentially stacked. The first inorganic thin layer IOL10 may have a double-layer structure. A first sub-layer S10 and a second sub-layer S20 may have different inorganic materials. The second inorganic thin layer IOL20 may have a double-layer structure. The second inorganic thin layer IOL20 may include a first sub-layer S100 and a second sub-layer S200, which are deposited in different environments from each other. The first sub-layer S100 may be deposited at a lower power level, and the second sub-layer S200 may be deposited at high power. The first and second sub-layers S100 and S200 may include the same inorganic material.

Figure 7A:
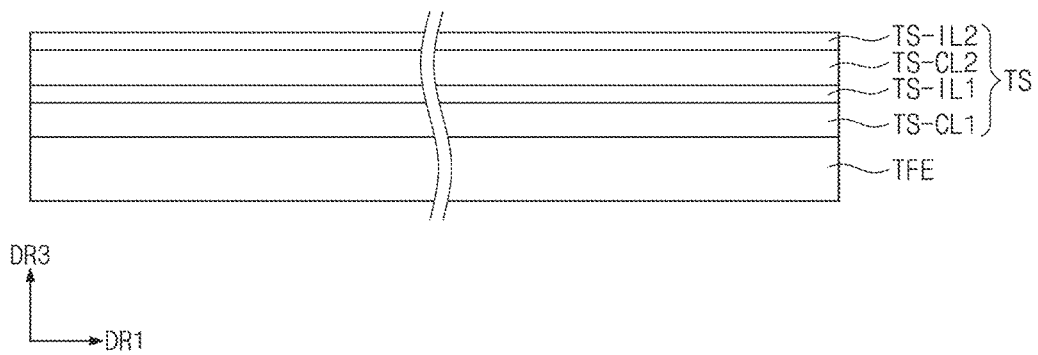
FIG. 7A is a cross-sectional view showing a touch sensor layer according to an exemplary embodiment of the present disclosure.

FIG. 7A is a cross-sectional view showing a touch sensor layer according to an exemplary embodiment of the present disclosure.

Referring to FIG. 7A, the touch sensor layer TS includes a first conductive layer TS-CL1, a first insulating layer (hereinafter, referred to as a "first touch insulating layer") TS-IL1, a second conductive layer TS-CL2, and a second insulating layer (hereinafter, referred to as a "second touch insulating layer") TS-IL2. The first conductive layer TS-CL1 is directly disposed on the thin film encapsulation layer TFE, but the present invention should not be limited thereto or thereby. That is, another inorganic layer (e.g., a buffer layer, not shown) may be further disposed between the first conductive layer TS-CL1 and the thin film encapsulation layer TFE.

Each of the first conductive layer TS-CL1 and the second conductive layer TS-CL2 has a single-layer structure or a multi-layer structure of plural layers stacked in the third direction DR3. The conductive layer having the multi-layer structure includes two or more layers among transparent conductive layers and metal layers. The conductive layer having the multi-layer structure includes metal layers including metals that may be different from each other. The transparent conductive layer includes indium tin oxide (ITO), indium zinc oxide (IZO), zinc oxide (ZnO), indium tin zinc oxide (ITZO), PEDOT, a metal nano-wire, or a graphene. The metal layer includes molybdenum, silver, titanium, copper, aluminum, or an alloy thereof.

Each of the first conductive layer TS-CL1 and the second conductive layer TS-CL2 includes a plurality of patterns. Hereinafter, the first conductive layer TS-CL1 includes first conductive patterns, and the second conductive layer TS-CL2 includes second conductive patterns. Each of the first and second conductive patterns includes touch electrodes and touch signal lines.

The first touch insulating layer TS-IL1 includes an inorganic material or an organic material. The inorganic material includes at least one of aluminum oxide, titanium oxide, silicon oxide, silicon oxynitride, zirconium oxide, and hafnium oxide. The organic material includes at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The second touch insulating layer TS-IL2 has a single-layer structure or a multi-layer structure. The organic material includes at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyimide-based resin, and a perylene-based resin.

Each of the first touch insulating layer TS-IL1 and the second touch insulating layer TS-IL2 has a single-layer structure or a multi-layer structure. The first touch insulating layer TS-IL1 includes at least one of an inorganic layer and an organic layer. The second touch insulating layer TS-IL2 includes at least one organic layer. The inorganic layer and the organic layer are formed by a chemical vapor deposition method.

The first touch insulating layer TS-IL1 should not be limited to a specific shape if the first touch insulating layer TS-IL1 insulates the first conductive layer TS-CL1 and the second conductive layer TS-CL2. The shape of the first touch insulating layer TS-IL1 is determined depending on a shape of the first and second conductive patterns. The first touch insulating layer TS-IL1 entirely covers the thin film encapsulation layer TFE or includes a plurality of insulating patterns. The insulating patterns are overlapped with first connection parts CP1 and second connection parts CP2 described later.

In the present exemplary embodiment, the two-layer type touch sensor layer has been described, but the touch sensor layer should not be limited to the two-layer type. A single-layer type touch sensor layer includes a conductive layer and an insulating layer covering the conductive layer. The conductive layer includes touch sensors and touch signal lines connected to the touch sensors. The single-layer type touch sensor layer obtains coordinate information using a self-capacitance method.

FIGS. 7B to 7E are plan views showing a touch sensor layer according to an exemplary embodiment of the present disclosure.

Figure 7B:
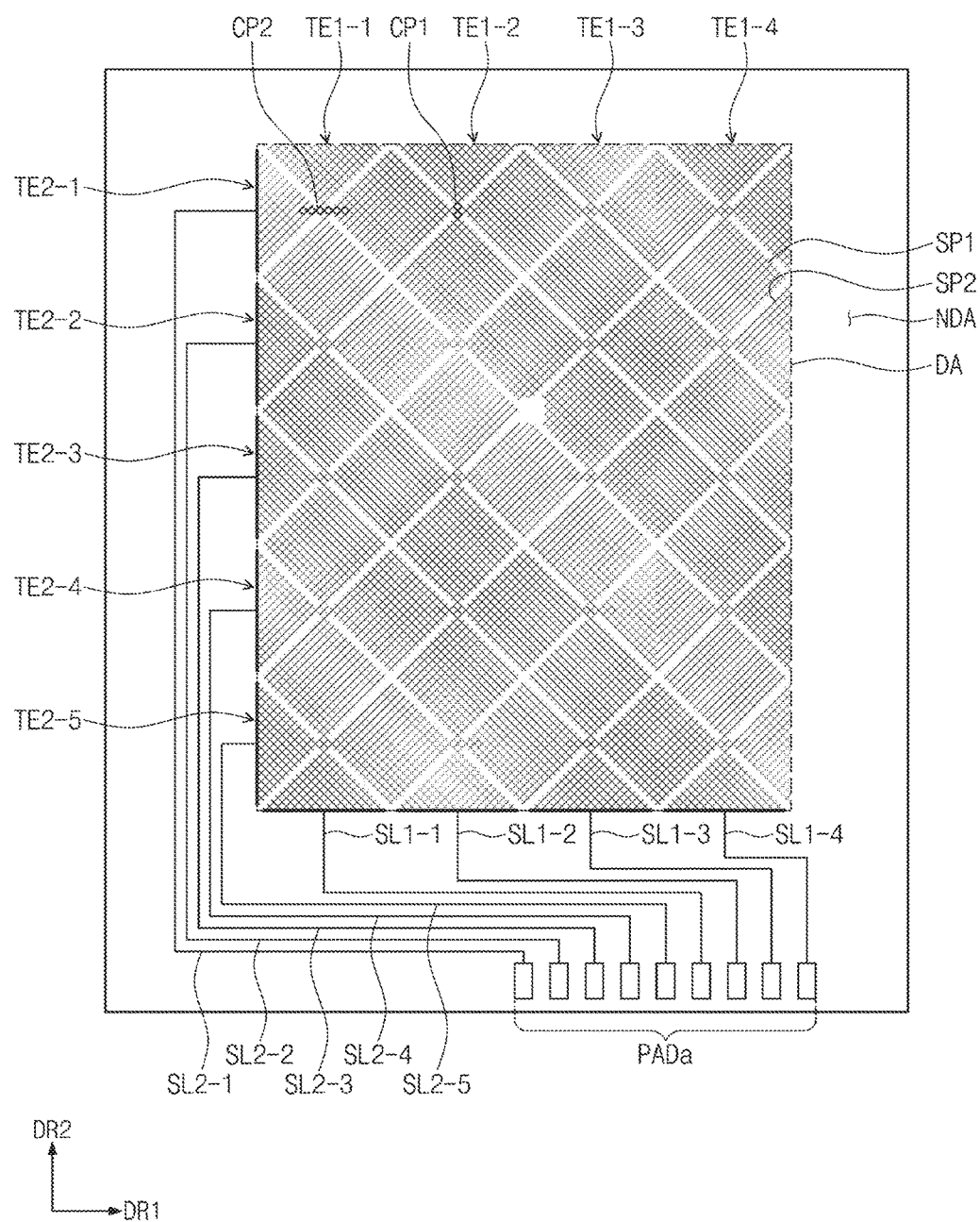

Referring to FIG. 7B, the touch sensor layer TS includes first touch electrodes TE1-1 to TE1-4, first touch signal lines SL1-1 to SL1-4 connected to the first touch electrodes TE1-1 to TE1-4, second touch electrodes TE2-1 to TE2-5, second touch signal lines SL2-1 to SL2-5 connected to the second touch electrodes TE2-1 to TE2-5, and a pad part PADa connected to the first touch signal lines SL1-1 to SL1-4 and the second touch signal lines SL2-1 to SL2-5. FIG. 7B shows the touch sensor layer TS configured to include four first touch electrodes TE1-1 to TE1-4 and five second touch electrodes TE2-1 to TE2-5, but the number of the first touch electrodes and the number of the second touch electrodes should not be limited thereto or thereby.

Each of the first touch electrodes TE1-1 to TE1-4 has a mesh shape through which a plurality of touch openings is defined. Each of the first touch electrodes TE1-1 to TE1-4 includes a plurality of first touch sensor parts SP1 and a plurality of first connection parts CP1. The first touch sensor parts SP1 are arranged in the first direction DR1. Each of the first connection parts CP1 connects two first touch sensor parts SP1 adjacent to each other among the first touch sensor parts SP1. Although not shown in detail, the first touch signal lines SL1-1 to SL1-4 may have a mesh shape.

The second touch electrodes TE2-1 to TE2-5 are insulated from the first touch electrodes TE1-1 to TE1-4 while crossing the first touch electrodes TE1-1 to TE1-4. Each of the second touch electrodes TE2-1 to TE2-5 has a mesh shape through which a plurality of touch openings is defined. Each of the second touch electrodes TE2-1 to TE2-5 includes a plurality of second touch sensor parts SP2 and a plurality of second connection parts CP2. The second touch sensor parts SP2 are arranged in the second direction DR2. Each of the second connection parts CP2 connects two second touch sensor parts SP2 adjacent to each other among the second touch sensor parts SP2. Although not shown in detail, the second touch signal lines SL2-1 to SL2-5 may have a mesh shape.

The first touch electrodes TE1-1 to TE1-4 are capacitively coupled to the second touch electrodes TE2-1 to TE2-5. When the touch sensing signals are applied to the first touch electrodes TE1-1 to TE1-4, capacitors are formed between the first touch sensor parts SP1 and the second touch sensor parts SP2.

A portion of the first touch sensor parts SP1, the first connection parts CP1, the first touch signal lines SL1-1 to SL1-4, the second touch sensor parts SP2, the second connection parts CP2, and the second touch signal lines SL2-1 to SL2-5 is formed by patterning the first conductive layer TS-CL1 shown in FIG. 7A, and the other portion of the first touch sensor parts SP1, the first connection parts CP1, the first touch signal lines SL1-1 to SL1-4, the second touch sensor parts SP2, the second connection parts CP2, and the second touch signal lines SL2-1 to SL2-5 is formed by patterning the second conductive layer TS-CL2 shown in FIG. 7A.

To electrically connect conductive patterns disposed on different layers, a contact hole may be formed through the first touch insulating layer TS-IL1 shown in FIG. 7A. Hereinafter, the touch sensor layer TS will be described with reference to FIGS. 7C to 7E.

Figure 7C:
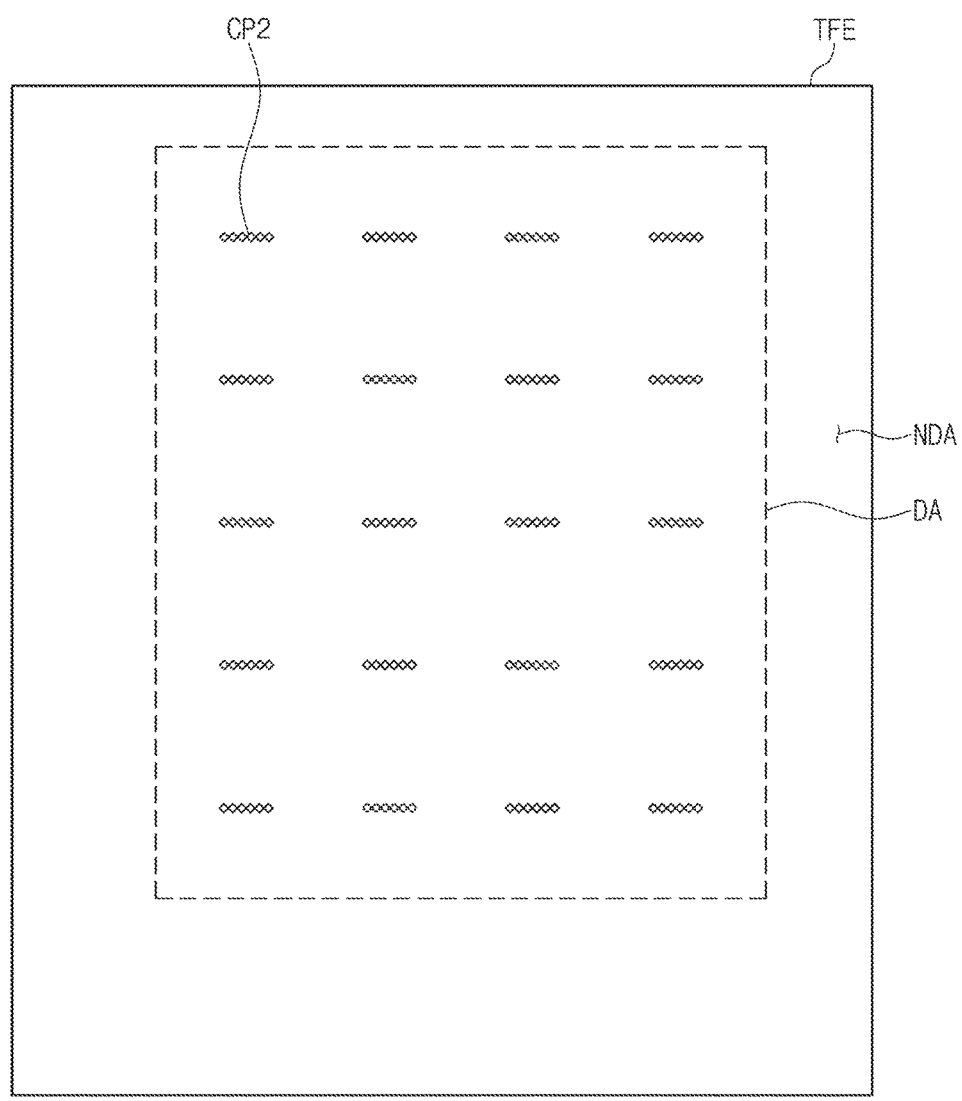

Referring to FIG. 7C, the first conductive patterns are disposed on the thin film encapsulation layer TFE. The first conductive patterns include the second connection parts CP2. The second connection parts CP2 are directly disposed on the thin film encapsulation layer TFE. Referring to FIG. 7D, the first touch insulating layer TS-IL1 is disposed on the thin film encapsulation layer TFE to cover the second connection part CP2. Contact holes CH are defined through the first touch insulating layer TS-IL1 to partially expose the second connection part CP2. The contact holes CH are formed by a photolithography process.

Figure 7E:
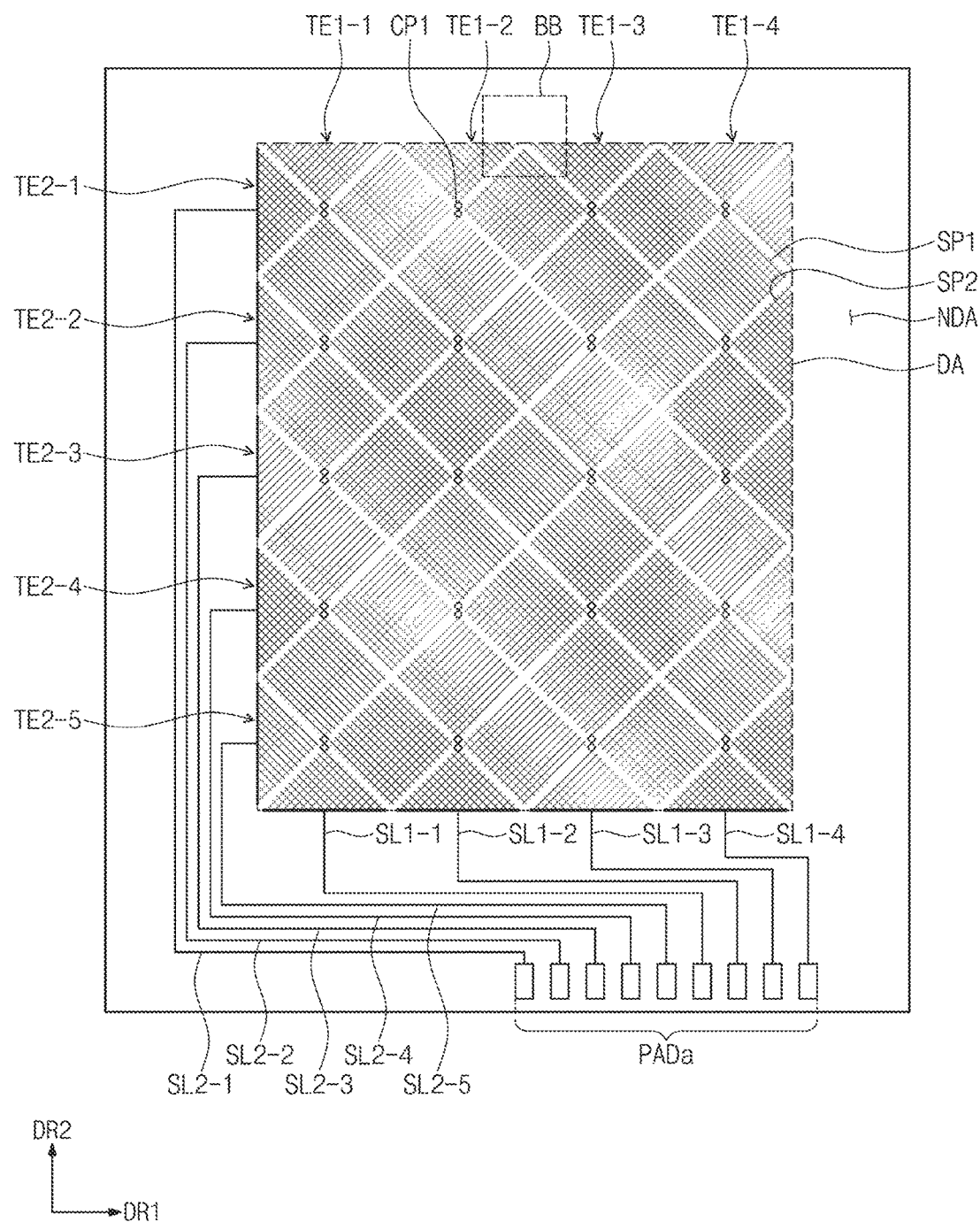

Referring to FIG. 7E, the second conductive patterns are disposed on the first touch insulating layer TS-IL1. The second conductive patterns include the first touch sensor parts SP1, the first connection parts CP1, the first touch signal lines SL1-1 to SL1-4, the second touch sensor parts SP2, and the second touch signal lines SL2-1 to SL2-5. Although not shown separately, the second touch insulating layer TS-IL2 is further disposed on the first touch insulating layer TS-IL1 to cover the second conductive patterns. The second touch insulating layer TS-IL2 will be described in detail later.

According to another exemplary embodiment of the present disclosure, the first conductive patterns include first touch electrodes TE1-1 to TE1-4 and first touch signal lines SL1-1 to SL1-4. The second conductive patterns include second touch electrodes TE2-1 to TE2-5 and second touch signal lines SL2-1 to SL2-5. In this case, the contact holes CH are not defined in the first touch insulating layer TS-IL1.

In addition, according to another exemplary embodiment of the present disclosure, the first conductive patterns and the second conductive patterns may be changed with respect to each other. That is, the second conductive patterns may include the second connection part CP2.

Figure 7F:
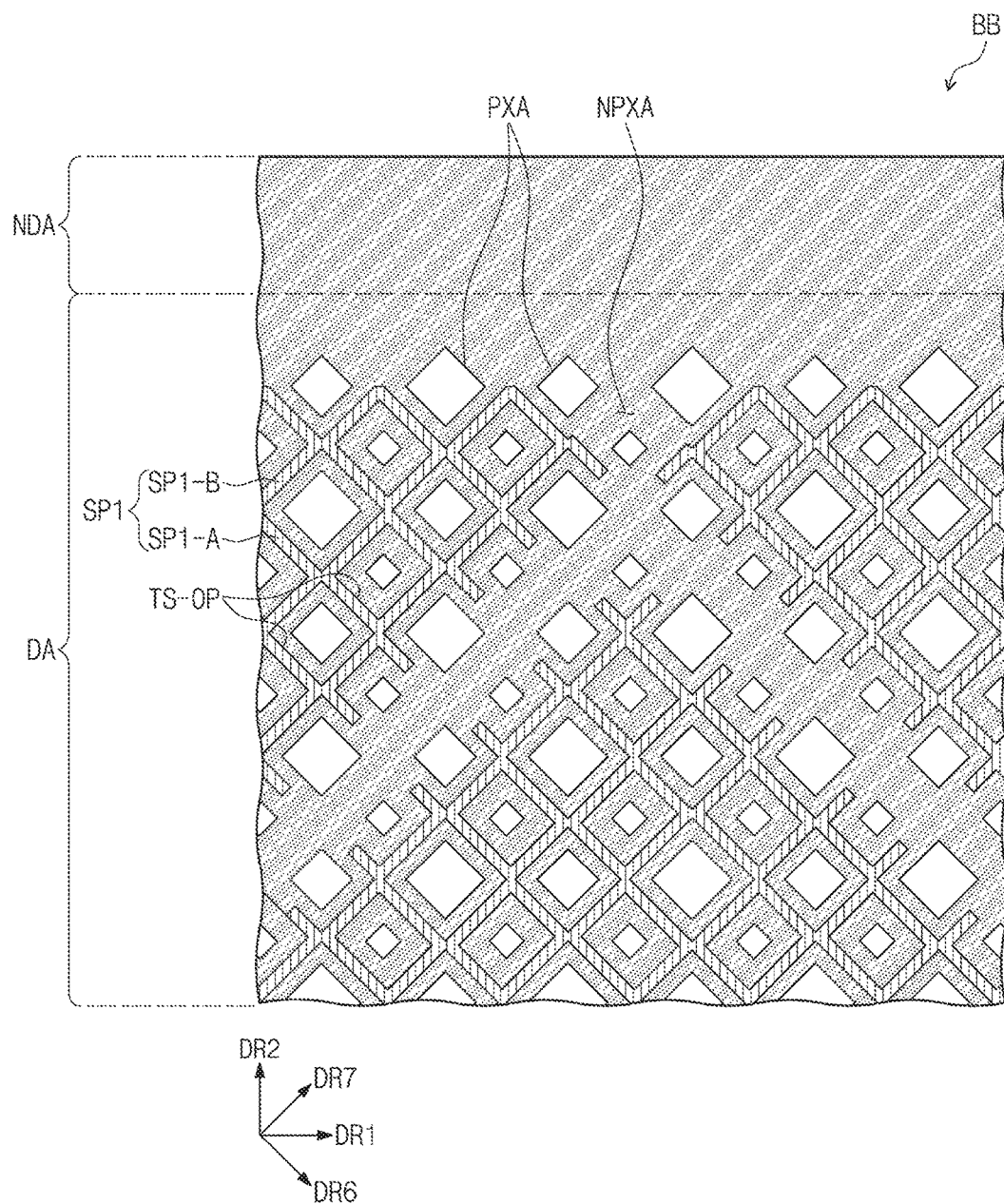
FIG. 7F is a partially enlarged view showing an area BB of FIG. 7E.

FIG. 7F is a partially enlarged view showing an area BB of FIG. 7E.

Referring to FIG. 7F, the first touch sensor part SP1 is overlapped with the non-light emitting area NPXA. The first touch sensor part SP1 includes a plurality of first extension parts SP1-A extending in a sixth direction DR6 crossing the first and second directions DR1 and DR2 and a plurality of second extension parts SP1-B extending in a seventh direction DR7 crossing the sixth direction DR6. The first extension parts SP1-A and the second extension parts SP1-B may be defined as mesh lines. Each mesh line has a line width of a few micrometers.

The first extension parts SP1-A are connected to the second extension parts SP1-B to define a plurality of touch openings TS-OP. In other words, the first touch sensor part SP1 has a mesh shape defined by the touch openings TS-OP. The touch openings TS-OP correspond to the light emitting areas PXA in a one-to-one correspondence, but they should not be limited thereto or thereby. That is, one touch opening TS-OP may correspond to two or more light emitting areas PXA.

The light emitting areas PXA may have various sizes. For instance, among the light emitting areas PXA, the size of the light emitting areas PXA emitting a blue light may be different from the size of the light emitting areas PXA emitting a red light. Accordingly, the touch openings TS-OP may have various sizes. In FIG. 7F, the light emitting areas PXA have various sizes, but the light emitting areas PXA may all have the same size, and the touch openings OP may also all have the same size.

FIGS. 8A to 8D are cross-sectional views showing display devices according to exemplary embodiments of the present disclosure. For the convenience of explanation, FIGS. 8A to 8D show the cross-section corresponding to an area AA of FIG. 4B. Hereinafter, the display devices according to various embodiments of the present disclosure will be described in detail with reference to FIGS. 8A to 8D. In FIGS. 8A to 8D, the same reference numerals denote the same elements in FIGS. 1A to 7F, and thus, detailed descriptions of the same elements will be omitted.

Referring to FIGS. 8A to 8D, a display device includes a base member BSM, a circuit layer DP-CL, a display layer DP-OLED, a thin film encapsulation layer TFE, and a touch sensor layer TS.

The base member BSM includes a first area AR1 and a second area AR2. The first area AR1 includes a first sub-area AR1-1 and a second sub-area AR1-2. The first area AR1 includes a display area and a non-display area. The first sub-area AR1-1 corresponds to the display area. The second sub-area AR1-2 corresponds to the first non-display area. The second area AR2 corresponds to the second non-display area. The second area AR2 may correspond to an outermost area of the display device.

The base member BSM includes a base layer SUB and a buffer layer BFL.

The base layer SUB may be a flexible substrate and may include a plastic substrate, a glass substrate, a metal substrate, or an organic/inorganic-mixed material substrate. The plastic substrate includes at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. The buffer layer BFL includes an inorganic material. The buffer layer BFL may include silicon oxide or silicon nitride.

In FIGS. 8A to 8D, the buffer layer BFL is disposed on the base layer SUB as a functional layer, but a barrier layer may be disposed as the functional layer. According to another exemplary embodiment, the buffer layer BFL may be omitted from the display device.

In FIGS. 8A to 8D, the second area AR2 has a flat shape, but the second area AR2 may be curved at a constant curvature in the third direction DR3.

The circuit layer DP-CL is disposed on the base member BSM. The circuit layer DP-CL covers the first area AR1 and exposes the second area AR2. The circuit layer DP-CL covers the first sub-area AR1-1 and the second sub-area AR1-2. The circuit layer DP-CL exposes the second area AR2.

The circuit layer DP-CL includes a thin film transistor TR, conductive lines E-VSS and CL, and at least one insulating layer.

A semiconductor pattern OSP of the thin film transistor TR is disposed on the base layer SUB. The semiconductor pattern OSP includes amorphous silicon, polysilicon, or metal oxide semiconductor. The insulating layer includes a first insulating layer 10 and a second insulating layer 20. An end of the first insulating layer 10 and an end of the second insulating layer 20 are aligned parallel to each other. In other words, one end of the first insulating layer 10 and one end of the second insulating layer 20 are disposed adjacent to an outer portion of the display device. An end of the circuit layer DP-CL is defined by the end of the insulating layer disposed at an outermost position among the end of the first insulating layer 10 and the end of the second insulating layer 20. The end of the insulating layer defines a boundary between the first area AR1 and a second area AR2. The end of the insulating layer defines ends of the second sub-area AR1-2 and the second area AR2.

The first insulating layer 10 is disposed above the base layer SUB to cover the semiconductor pattern OSP. The first insulating layer 10 includes an organic layer and/or an inorganic layer. The first insulating layer 10 includes a plurality of inorganic thin layers. The inorganic thin layers include a silicon nitride layer and a silicon oxide layer.

A control electrode GE of the thin film transistor TR is disposed on the first insulating layer 10. The control electrode GE is formed through the same photolithography process as the gate lines GL (refer to FIG. 4A). The control electrode GE includes the same material and the same stack structure as those of the gate lines, and is disposed on the same layer.

The second insulating layer 20 is disposed on the first insulating layer 10 to cover the control electrode GE. The second insulating layer 20 includes an organic layer and/or an inorganic layer. The second insulating layer 20 includes a plurality of inorganic thin layers. The inorganic thin layers include a silicon nitride layer and a silicon oxide layer. The second insulating layer 20 includes a material different from that of the first insulating layer 10.

An input electrode SE and an output electrode DE of the thin film transistor TR are disposed on the second insulating layer 20. The signal lines CL and the power supply line E-VSS are disposed on the second insulating layer 20.

A first dam part DM1 and a second dam part DM2 are disposed in the second sub-area AR1-2. The first and second dam parts DM1 and DM2 are disposed to surround the first sub-area AR1-1 when viewed in a plan view. When the organic monomer is printed to form the organic thin layer OL1 of the thin film encapsulation layer TFE, the first and second dam parts DM1 and DM2 may prevent the organic monomer from overflowing.

The first dam part DM1 is disposed on the power supply line E-VSS. The first dam part DM1 has a single-layer structure and is substantially simultaneously formed with the pixel definition layer PDL.

The second dam part DM2 is disposed outside the first dam part DM1. For instance, a distance between the second dam part DM2 and the first sub-area AR1-1 is greater than a distance between the first dam part DM1 and the first sub-area AR1-1.

The second dam part DM2 covers a portion of the power supply line E-VSS. The second dam part DM2 includes a plurality of layers, e.g., a first layer DM2-L1 and a second layer DM2-L2.

A third insulating layer 30 is disposed on the second insulating layer 20 to cover the input electrode SE and the output electrode DE. The third insulating layer 30 includes an organic layer and/or an inorganic layer. The third insulating layer 30 includes an organic material to provide a flat surface.

One of the first insulating layer 10, the second insulating layer 20, and the third insulating layer 30 may be omitted in accordance with the circuit structure of the pixel. Each of the second and third insulating layers 20 and 30 may be referred to as an "interlayer". The interlayer is disposed between conductive patterns, e.g., upper and lower conductive patterns, to insulate the conductive patterns from each other.

The display layer DP-OLED is disposed on the third insulating layer 30. The pixel definition layer PDL and the organic light emitting diode OLED are disposed on the third insulating layer 30. A first electrode AE is disposed on the third insulating layer 30. The first electrode AE is connected to the output electrode DE through a contact hole defined through the third insulating layer 30. A light emitting area is defined in the pixel definition layer PDL. At least a portion of the first electrode AE is exposed through the light emitting area of the pixel definition layer PDL.

A light emitting unit EU is disposed on the first electrode AE. A second electrode CE is disposed on the light emitting unit EU. Although not shown in figures, the light emitting unit EU may include a hole control layer HCL, an organic light emitting layer EML, and an electron control layer ECL as shown in FIG. 5C.

A connection electrode E-CNT is disposed on the same layer as the first electrode AE. The first electrode AE and the connection electrode E-CNT are disposed on the third insulating layer 30. The first electrode AE and the connection electrode E-CNT are formed through the same process. The connection electrode E-CNT is electrically connected to the power supply line E-VSS. The connection electrode E-CNT receives the second voltage ELVSS (refer to FIG. 5A) from the power supply line E-VSS. Although not shown in the figures, the connection electrode E-CNT is disposed to partially overlap with a first layer DM2-L1 of the second dam part DM2.

In the present exemplary embodiment, the thin film encapsulation layer TFE directly covers the second electrode CE. In the present exemplary embodiment, a capping layer may be further disposed to cover the second electrode CE. In this case, the thin film encapsulation layer TFE directly covers the capping layer. The thin film encapsulation layer TFE includes a first inorganic thin layer IOL10, a first organic thin layer OL1, and a second inorganic thin layer IOL20, which are sequentially stacked, but it should not be limited thereto or thereby. The thin film encapsulation layer TFE may include a plurality of inorganic thin layers and a plurality of organic thin layers.

An end of the thin film encapsulation layer TFE is disposed on the first area AR1. The end of the thin film encapsulation layer TFE is disposed to be closer to a center of the display device than the ends of the first and second insulating layers 10, 20.

The touch sensor layer TS is disposed on the thin film encapsulation layer TFE. The touch sensor layer TS includes the first touch insulating layer TS-IL1, a plurality of conductive patterns disposed on the first touch insulating layer TS-IL1, and the second touch insulating layer TS-IL2 disposed on the conductive patterns. The conductive patterns include touch sensor parts SP disposed in the first sub-area AR1-1 and the touch signal lines SL disposed in the second sub-area AR1-2.

The touch sensor parts SP correspond to the first touch sensor parts SP1 and the second touch sensor parts SP2 shown in FIGS. 7A to 7F, and the touch signal lines SL correspond to the first touch signal lines SL1-1 to SL1-4 and the second touch signal lines SL2-1 to SL2-5 shown in FIGS. 7A and 7F. Although not shown in the figures, the conductive patterns may further include patterns disposed between the first touch insulating layer TS-IL1 and the thin film encapsulation layer TFE. Hereinafter, duplicated explanation with respect to the touch sensor parts SP and the touch signal lines SL will be omitted.

An end of the first touch insulating layer TS-IL1 is disposed in the first area AR1. The end of the first touch insulating layer TS-IL1 is disposed in the second sub-area AR1-2. The end of the first touch insulating layer TS-IL1 is aligned to be parallel to the end of the thin film encapsulation layer TFE. The end of the first touch insulating layer TS-IL1 is disposed to be closer to the center of the display device than the ends of the first and second insulating layers 10 and 20.

The second touch insulating layer TS-IL2 includes an organic material. Hereinafter, for the convenience of explanation, the second touch insulating layer TS-IL2 is referred to as an "organic layer". The organic layer TS-IL2 is overlapped with the first sub-area AR1-1 and the second sub-area AR1-2. The organic layer TS-IL2 is overlapped with at least a portion of the second area AR2. The organic layer TS-IL2 covers the second area AR2. The organic layer TS-IL2 is disposed to directly make contact with an upper portion of the touch sensor layer TS. The organic layer TS-IL2 directly makes contact with and covers the first touch insulating layer TS-IL1 and the conductive patterns disposed on the first touch insulating layer TS-IL1. The organic layer TS-IL2 makes contact with a portion of the first touch insulating layer TS-IL1 and covers the touch sensor parts SP and the touch signal lines SL, which are disposed on the first touch insulating layer TS-IL1.

Figure 8A:
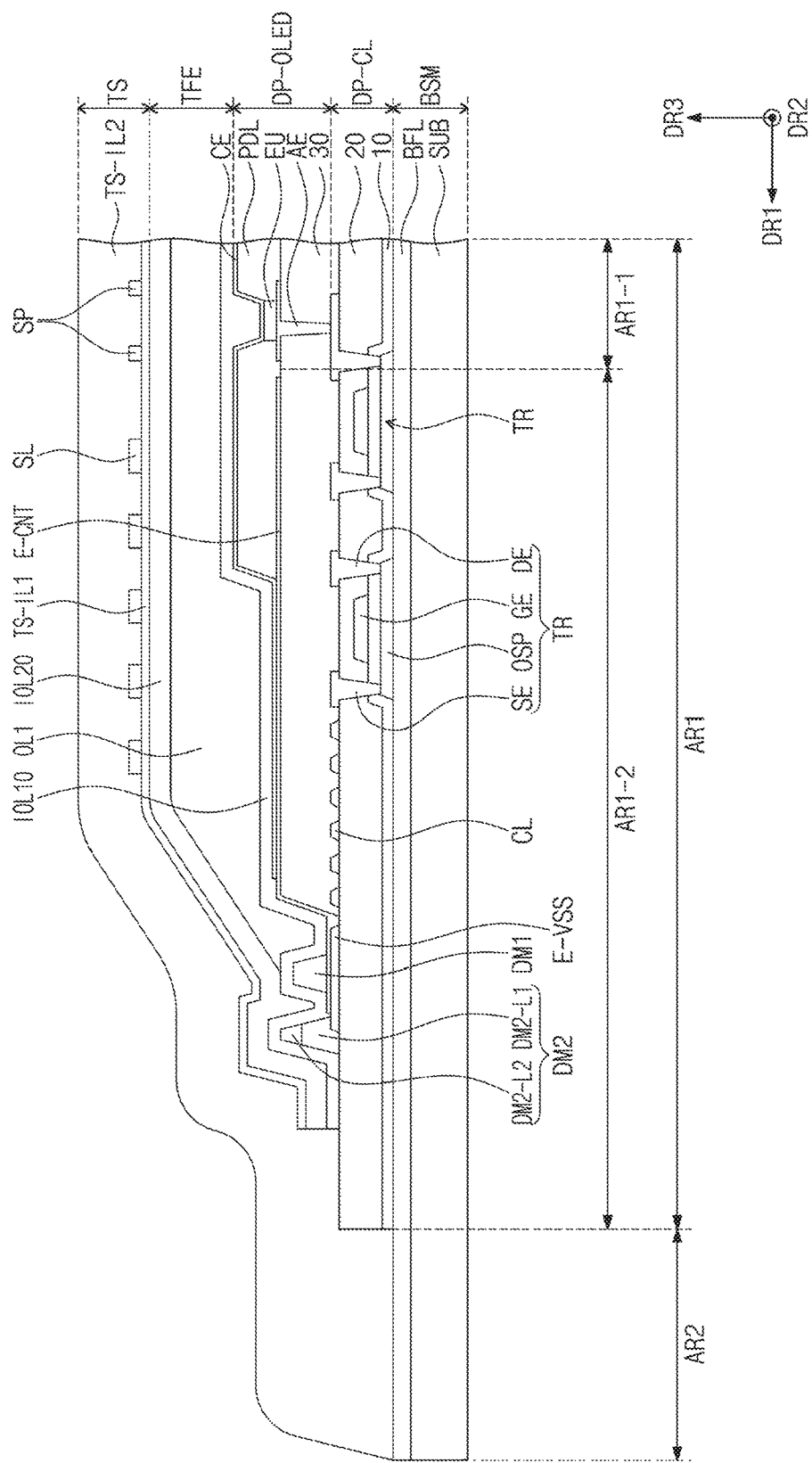
FIG. 8A, FIG. 8B, FIG. 8C, and FIG. 8D are partially enlarged views showing an area AA of FIG. 4B.
Figure 8B:
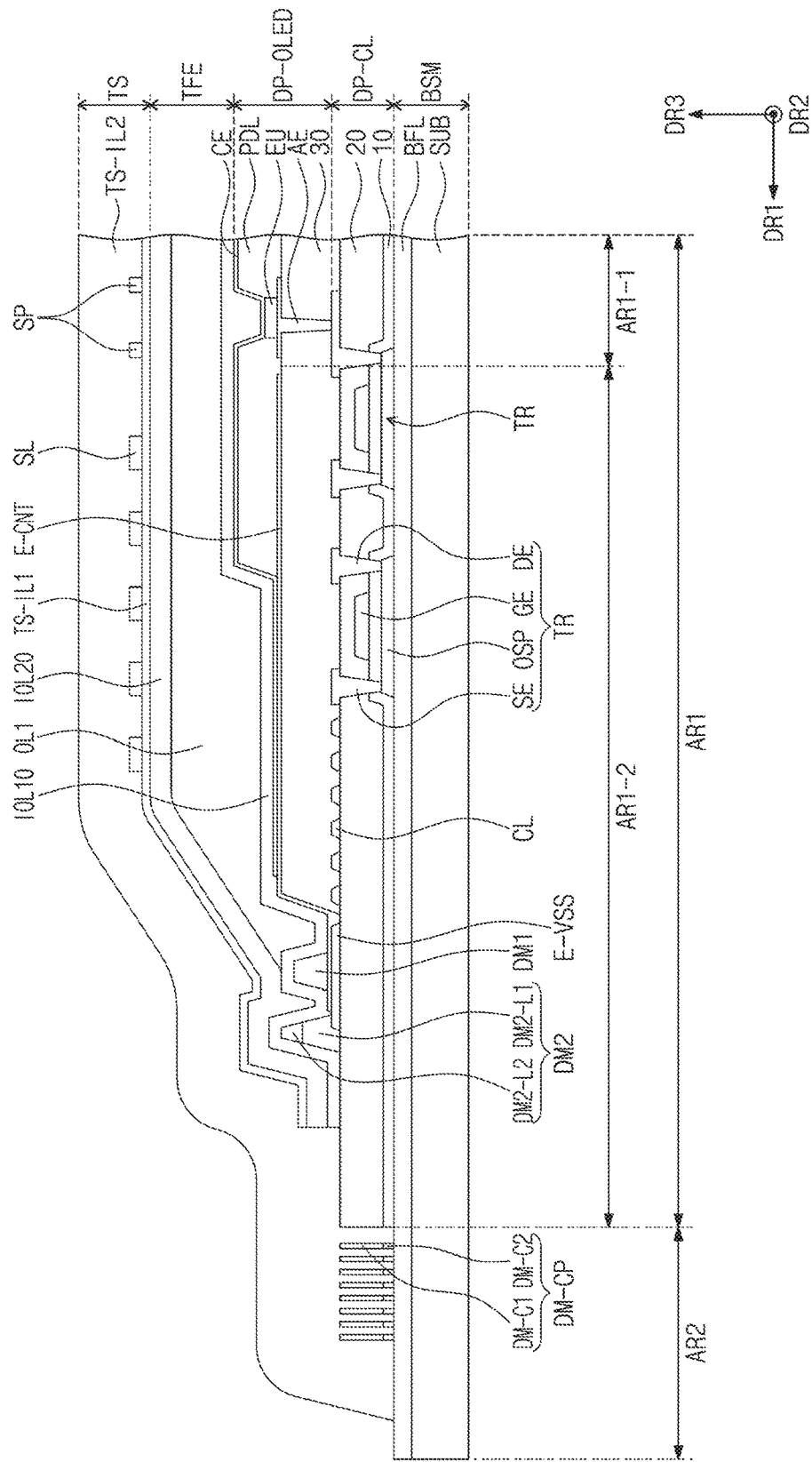
Figure 8C:
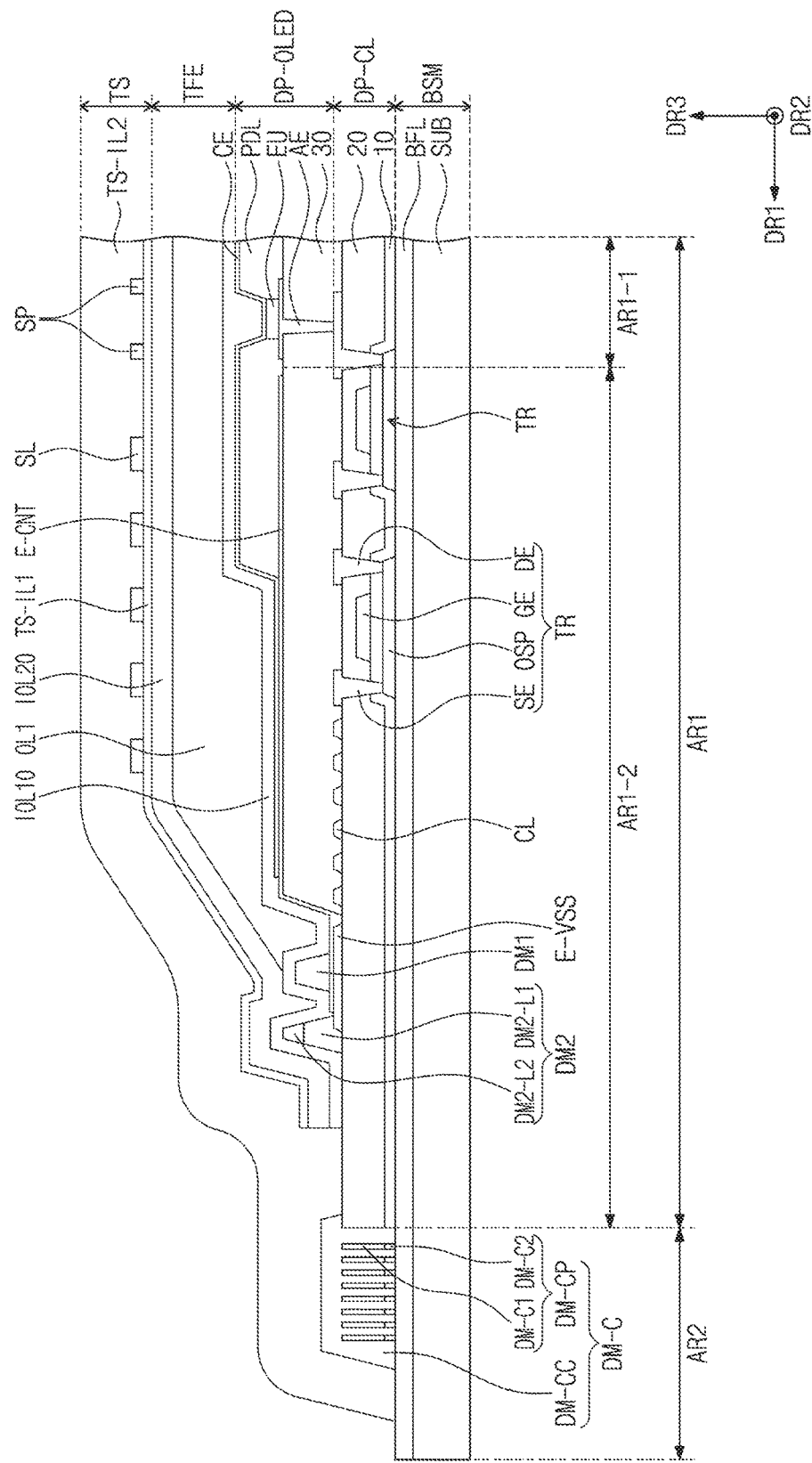
Figure 8D:
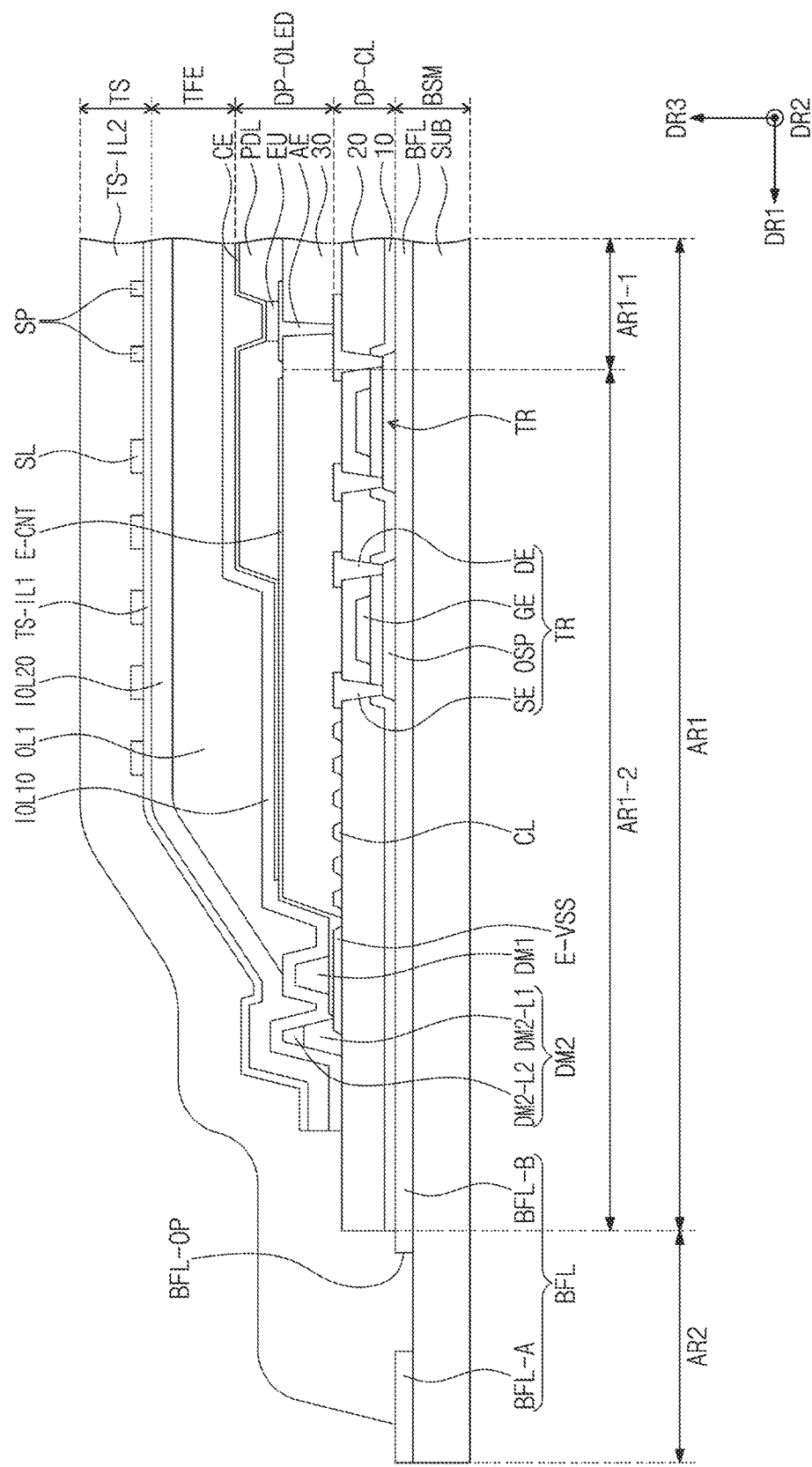

The organic layer TS-IL2 is overlapped with an entire surface of the insulation layer. The organic layer TS-IL2 is entirely overlapped with the first insulating layer 10 and the second insulating layer 20. The organic layer TS-IL2 is entirely overlapped with the second area AR2 when viewed in a plan view as shown in FIG. 8A to cover the end of the display device. As another example, the organic layer TS-IL2 may be overlapped with a portion of the second area AR2 when viewed in a plan view, as shown in FIGS. 8B to 8D. The organic layer TS-IL2 may be disposed to cover the ends of the thin film encapsulation layer TFE and the touch sensor layer TS.

Although not shown in the figures, the pad parts PD (refer to FIG. 4A) and the control signal line (refer to FIG. 4A) may be disposed in the area shown in FIGS. 8A to 8D and the other area of an outermost portion of the display panel DP. The pad parts PD are disposed to overlap with the second area AR2. In this case, the organic layer TS-IL2 may be disposed not to overlap with the pad parts PD. The organic layer TS-IL2 may expose the pad parts PD. The exposed pad parts PD may be easily and electrically connected to an external electrical component.

Referring to FIG. 8B, a display device may further include a shock-absorbing member disposed on the second area of the base layer SUB. The shock-absorbing member is disposed on the second area AR2 of the base layer SUB. The shock-absorbing member includes a plurality of insulating patterns DM-CP. The shock-absorbing member absorbs shocks generated outside the display device to prevent a fracture from occurring in the insulating layer.

The insulating patterns DM-CP are arranged in the first direction DR1 and spaced apart from each other. In the present exemplary embodiment, a bending axis of the second area AR2 is defined along the second direction DR2. The insulating patterns DM-CP are spaced apart from each other in the first direction DR1 and extend in the second direction DR2. The insulating patterns DM-CP extend in a direction parallel to the bending axis and are spaced apart from each other in a direction crossing the bending axis, and thus an influence exerting on the display device by the insulating patterns DM-CP may be reduced.

The organic layer TS-IL2 covers a side surface and an upper surface of the shock-absorbing member. The organic layer TS-IL2 covers each insulating pattern DM-CP of the shock-absorbing member. A space is defined between the insulating patterns DM-CP. The insulating patterns DM-CP are spaced apart from each other at regular intervals, but the interval between the insulating patterns DM-CP may not be constant. The organic layer TS-IL2 may fill in the spaces between the insulating patterns DM-CP. The organic layer TS-IL2 has a thickness equal to or greater than the insulating patterns DM-CP to entirely cover the insulating patterns DM-CP.

Each of the insulating patterns DM-CP includes a first layer DM-C1 and a second layer DM-C2. The first and second layers DM-C1 and CM-C2 are sequentially stacked. The first layer DM-C1 has the same thickness as that of the first insulating layer 10. The second layer DM-C2 has the same thickness as that of the second insulating layer 20.

The insulating patterns DM-CP include the same material as that of the first and second insulating layers 10, 20. The first layer DM-C1 includes the same material as that of the first insulating layer 10. The second layer DM-C2 includes the same material as that of the second insulating layer 20. The first layer DM-C1 is formed through the same process as the first insulating layer 10, and the second layer DM-C2 is formed through the same process as the second insulating layer 20.

Referring to FIG. 8C, the shock-absorbing member DM-C may further include a cover member DM-CC covering the insulating patterns DM-CP. The cover member DM-CC covers the entire surface of the insulating patterns DM-CP to prevent foreign substances from contacting the insulating patterns DM-CP. The cover member DM-CC is overlapped with the second area. The cover member DM-CC is partially overlapped with the first area. The cover member DM-CC is partially overlapped with the second sub-area AR1-2.

The organic layer TS-IL2 covers a side surface and an upper surface of the cover member DM-CC. Since the organic layer TS-I2 covers the side surface and the upper surface of the cover member DM-CC, the organic layer TS-IL2 may completely cover the shock-absorbing member DM-C without exposing the shock-absorbing member DM-C.

Referring to FIG. 8D, a buffer layer BFL of a display device according to the present exemplary embodiment includes a first buffer part BFL-A and a second buffer part BFL-B. The first buffer part BFL-A is spaced apart from the second buffer part BFL-B. At least one opening BFL-OP is defined between the first buffer part BFL-A and the second buffer part BFL-B.

The first buffer part BFL-A is disposed in the second area AR2. The first buffer part BFL-A is overlapped with the second area AR2. The opening BFL-OP is defined in the second area AR2. The opening BFL-OP has a predetermined width in the first direction DR1 and extends in the second direction DR2.

The organic layer TS-IL2 is filled in the opening BFL-OP. Since the organic layer TS-IL2 is filled in the opening BFL-OP, the organic layer TS-IL2 covers exposed side surfaces of the first and second buffer parts BFL-A and BFL-B.

The organic layer TS-IL2 according to the present exemplary embodiment covers components causing a step difference on the base member BSM. Accordingly, the organic layer TS-IL2 covers an end of the circuit layer DP-CL, which causes the step difference on the base member BSM, as shown in FIG. 8A, and covers the shock-absorbing member DM-C as shown in FIGS. 8B and 8C. In addition, the organic layer TS-IL2 cover the opening BFL-OP defined through the base member BSM as shown in FIG. 8D, and thus, the concave step difference may be covered.

In the present exemplary embodiment, the organic layer TS-IL2 disposed on the touch sensor layer TS covers the second area AR2, which is the outermost portion of the display module DM, and thus, a fracture may be prevented from occurring in the outer portion. In particular, in the case that the shock-absorbing member DM-C is disposed in the second area AR2 or the opening BFL-OP of the buffer layer BFL is defined in the second area AR2, the organic layer TS-IL2 covers the shock-absorbing member CM-C or is filled in the opening BFL-OP to relieve a stress generated upon bending the display device, and thus, the fracture may be prevented from occurring in the outer portion.

Hereinafter, a method of manufacturing the display device will be described in detail.

FIGS. 9A to 9I are cross-sectional views showing a method of manufacturing a display module shown in FIG. 8C.

Figure 9A:
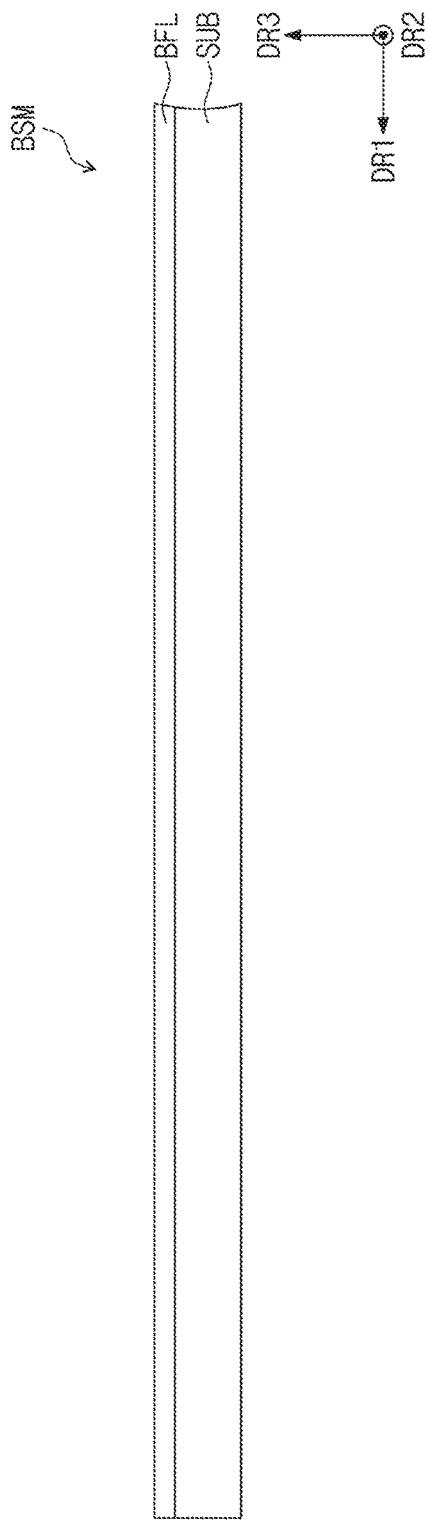
Figure 9B:
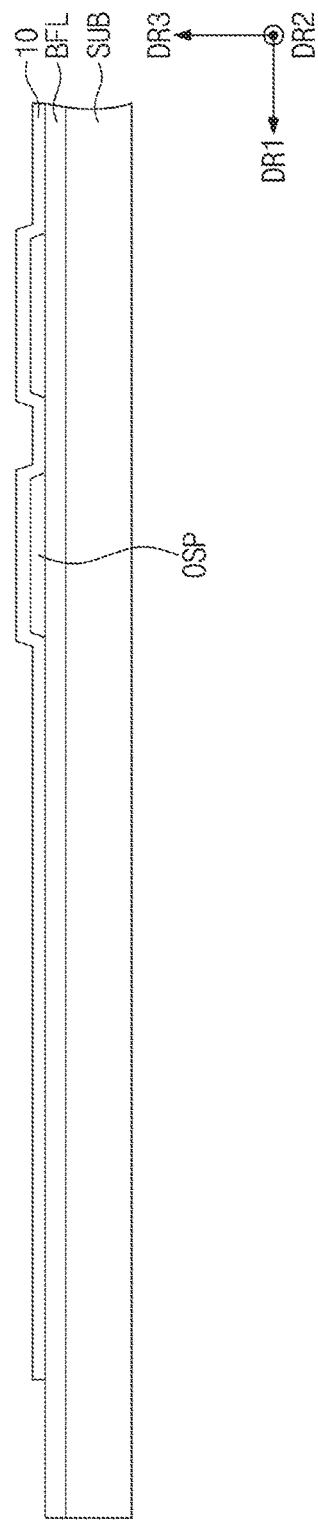

Referring to FIGS. 9A and 9B, the base layer SUB is prepared. The functional layers, such as the buffer layer BFL, may be further disposed on the one surface of the base layer SUB. At least the semiconductor pattern OSP is formed on the base layer SUB, and the first insulating layer 10 is formed on the base layer SUB to cover the semiconductor pattern OSP.

Referring to FIG. 9C, the control electrode GE is formed on the first insulating layer 10. The control electrode GE is formed to be disposed on the semiconductor pattern OSP. The control electrode GE is formed by a photolithography process. The second insulating layer 20 is formed to cover the control electrode GE formed on the first insulating layer 10. The end of the first insulating layer 10 and the end of the second insulating layer 20 are aligned parallel to each other. As another example, each of the first and second insulating layers 10 and 20 may be formed to entirely overlap with the base layer SUB.

Referring to FIG. 9D, the manufacturing method of the display device includes etching portions of the first and second insulating layers 10 and 20. In the etching process, outer portions of the first and second insulating layers 10 and 20 are partially etched to form the insulating patterns DM-CP. The insulating patterns DM-CP include the first layer DM-C1 and the second layer DM-C2. The first layer DM-C1 is formed by etching the portion of the first insulating layer 10, and the second layer DM-C2 is formed by etching the portion of the second insulating layer 20. In the etching process, a thru-hole TH1 is formed by etching the first and second insulating layers 10 and 20 to expose a portion of the semiconductor pattern OSP. The insulating patterns DM-CP may be substantially simultaneously formed using one mask together with the first and second insulating layers 10 and 20 forming the circuit layer DP-CL. Thus, a manufacturing time may be shortened, and a manufacturing cost may be reduced.

Figure 9E:
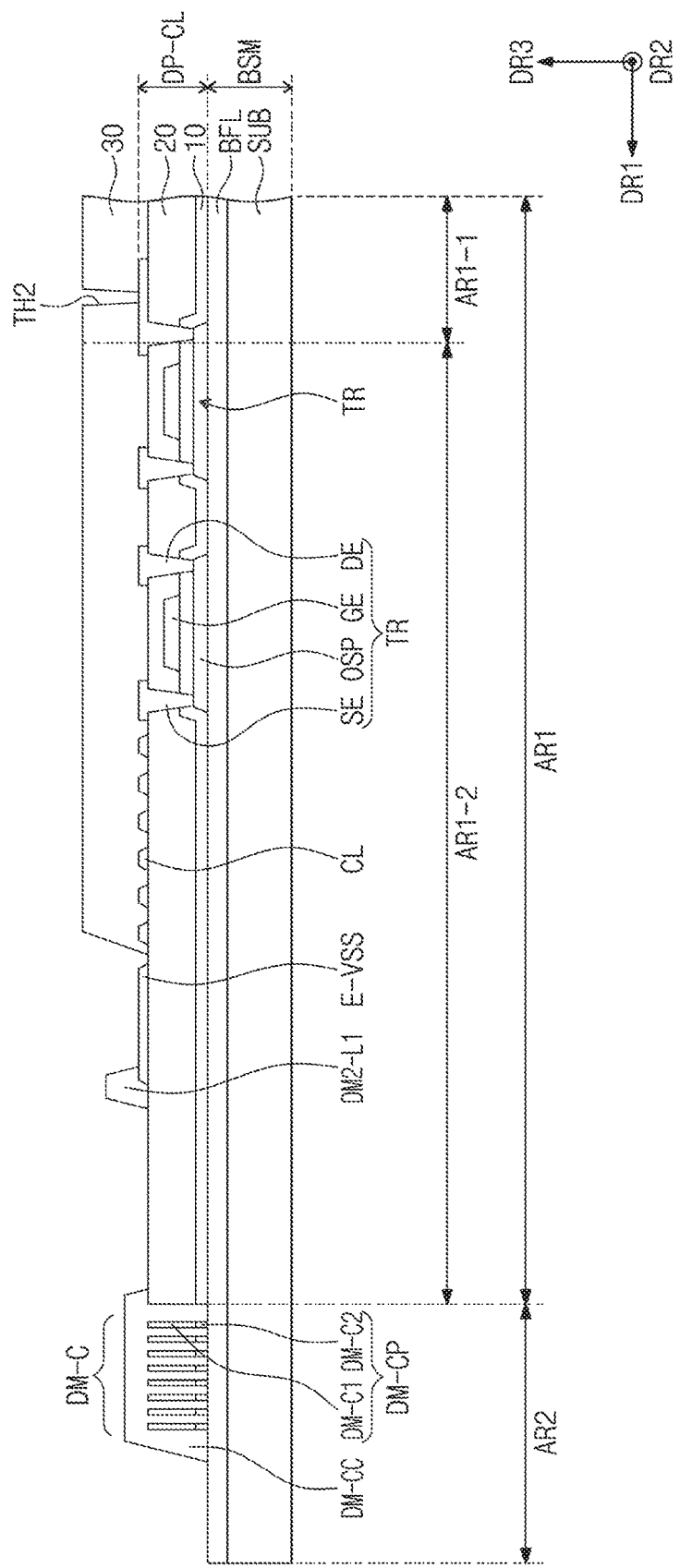

Referring to FIG. 9E, the output electrode DE, the input electrode SE, the signal lines CL, and the power supply line E-VSS are formed on the second insulating layer 20. The third insulating layer 30 is formed above the second insulating layer 20 to cover the thin film transistor TR and the signal lines CL. The third insulating layer 30 is formed to entirely overlap with the first and second insulating layers 10 and 20 and patterned. In this case, the first layer DM2-L1 of the second dam part DM2 (refer to FIG. 8C) and the cover member DM-CC of the shock-absorbing member DM-C may be formed. The first layer DM2-L1 of the second dam part is formed to overlap with a portion of the power supply line E-VSS. The third insulating layer 30, the first layer DM2-L1 of the second dam part, and the cover member DM-CC include the same material. In the etching process, a thru-hole TH2 is formed through the third insulating layer 30 to expose a portion of the input electrode SE.

Figure 9F:
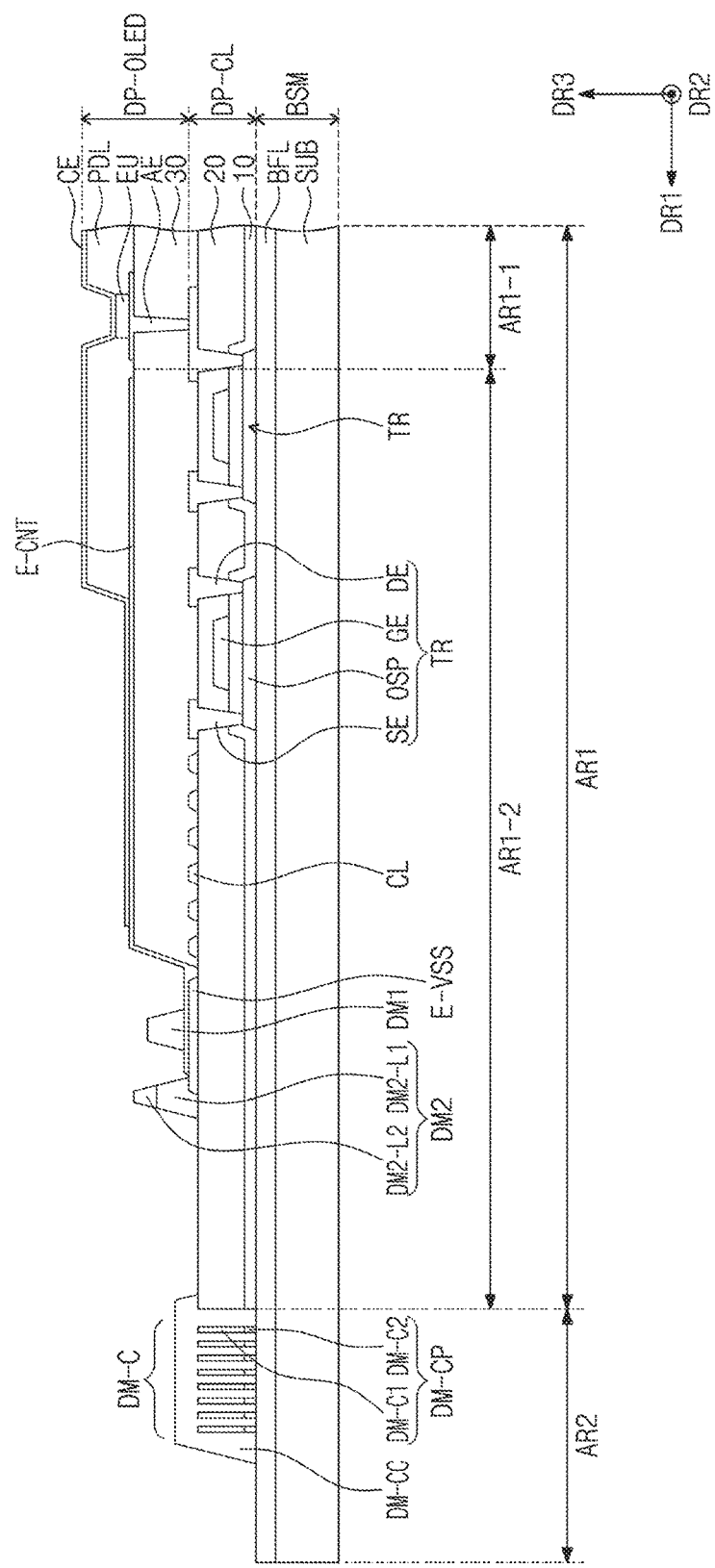

Referring to FIG. 9F, the first electrode AE connected to one of the output electrodes DE and the connection electrode E-CNT are formed. The first electrode AE and the connection electrode E-C NT are formed on the same layer. The first electrode AE and the connection electrode E-CNT are formed on the third insulating layer 30. The first electrode AE is connected to the thin film transistor TR through the third insulating layer 30.

The connection electrode E-CNT is electrically connected to the power supply line E-VSS. The connection electrode E-CNT receives the second voltage ELVSS (refer to FIG. 5A) from the power supply line E-VSS. Although not shown in figures, the connection electrode E-CNT is formed to be partially disposed on the first layer DM2-L1 of the second dam part DM2.

The light emitting unit EU, the pixel definition layer PDL, and the second electrode CE are formed on the third insulating layer 30. The light emitting unit EU is formed between the first electrode AE and the second electrode CE. In the process of forming the pixel definition layer PDL, the first dam part DM1 overlapped with the power supply line E-VSS and the second layer DM2-L2 overlapped with the first layer DM2-L1 of the second dam part DM2 are formed. The pixel definition layer PDL, the first dam part DM1, and the second layer DM2-L2 may be formed through the same material and may include the same material.

Figure 9G:
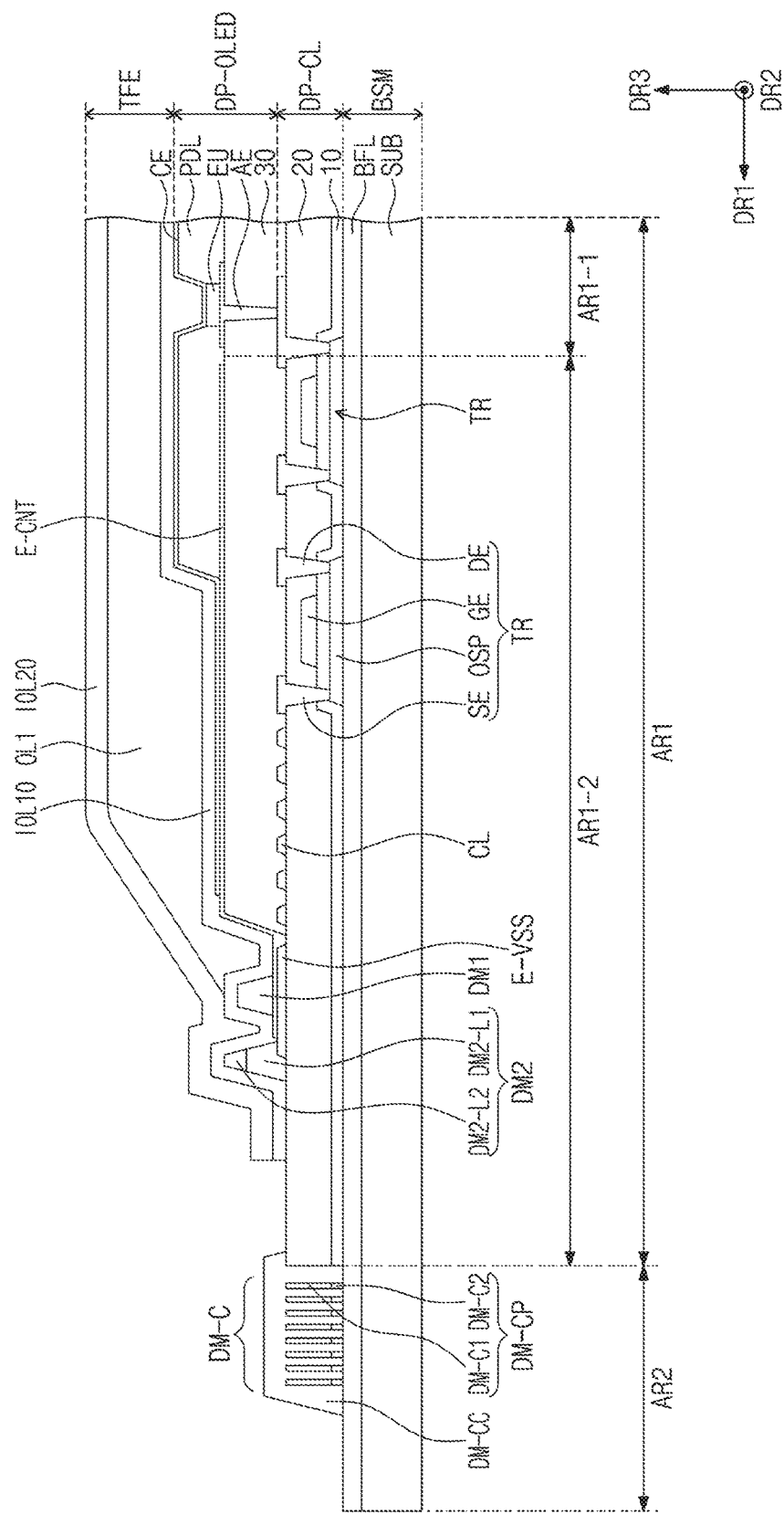

Referring to FIG. 9G, the thin film encapsulation layer TFE is formed on the display layer DP-OLED. The thin film encapsulation layer TFE is formed by sequentially forming the first inorganic thin layer IOL10, the first organic thin layer OL1, and the second inorganic thin layer IOL20. The first organic thin layer OL1 is formed by providing a liquid organic monomer on the first inorganic thin layer IOL10. The organic monomer does not flow over the first and second dam parts DM1 and DM2 by the first and second dam parts DM1 and DM2, and thus, the organic monomer is stably formed to have a predetermined thickness.

Figure 9H:
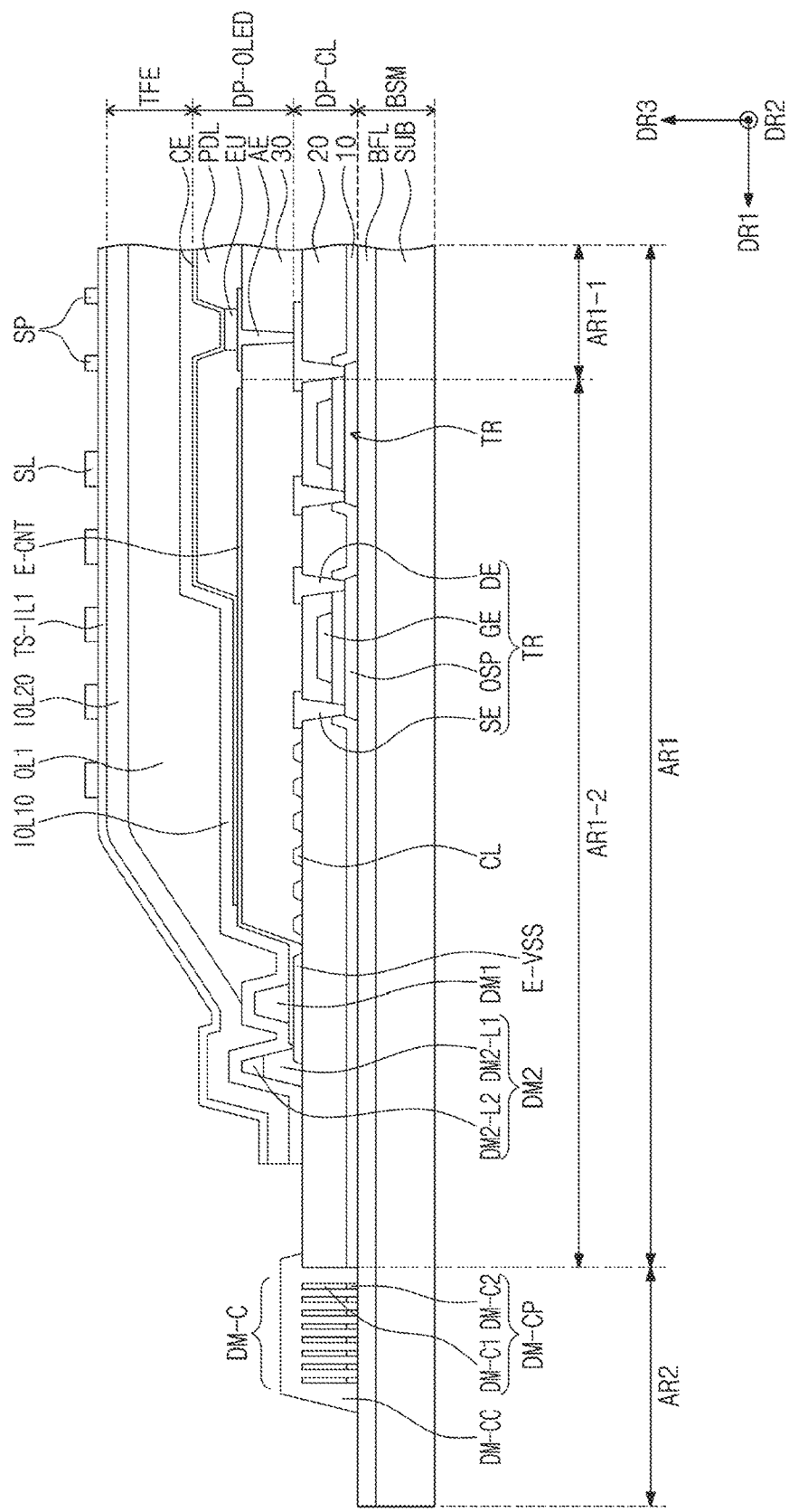
Figure 91:
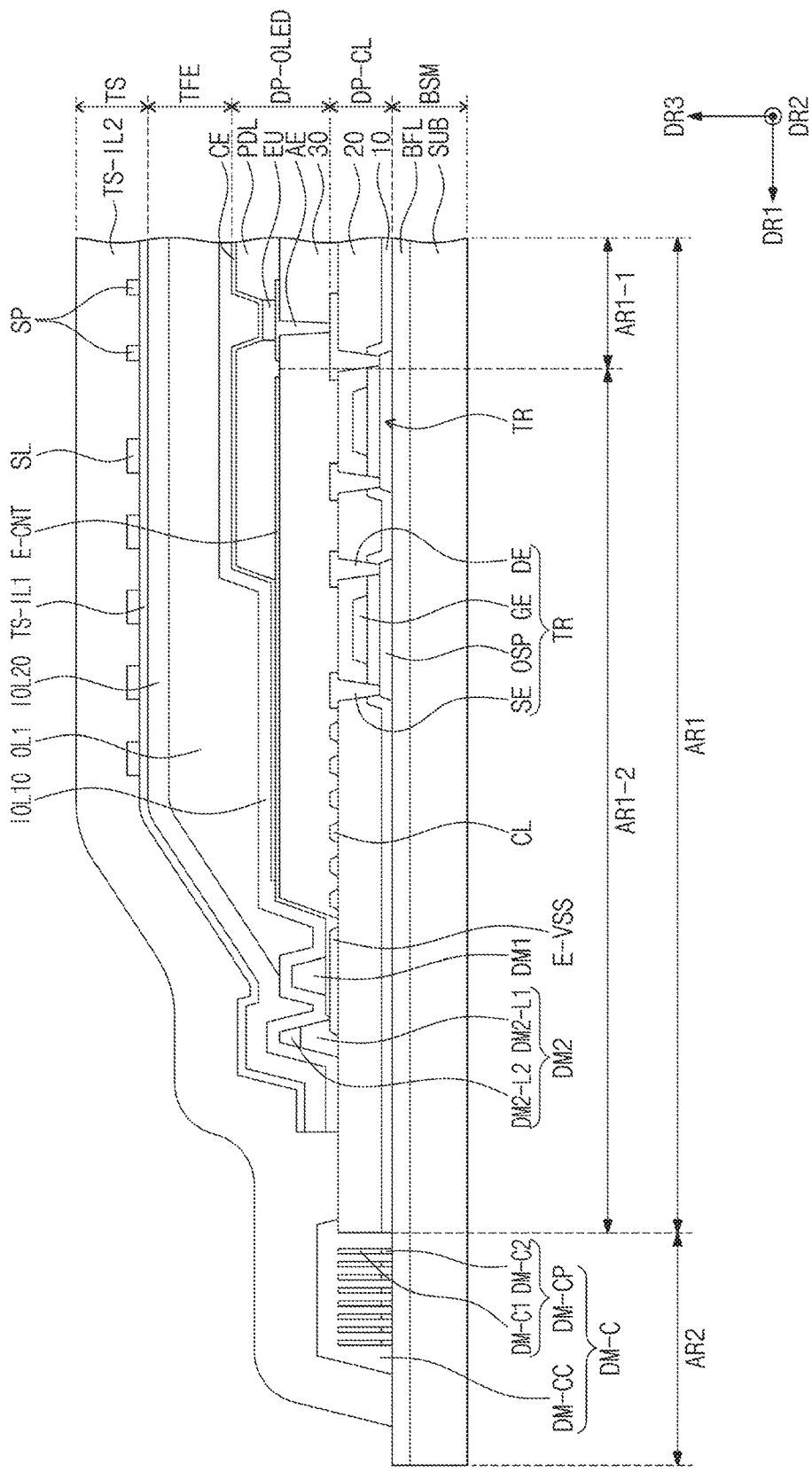

Referring to FIG. 9H, the first touch insulating layer TS-IL1 and the conductive patterns are formed on the thin film encapsulation layer TFE. The first touch insulating layer TS-IL1 is formed on the thin film encapsulation layer TFE, and the signal lines SL and the touch sensor parts SP are formed on the first touch insulating layer TS-IL1. The touch sensor parts SP are formed on the first sub-area AR1-1, and the signal lines SL are formed on the second sub-area AR1-2.

Referring to FIG. 9I, the organic layer TS-IL2 is formed on the first touch insulating layer TS-IL1. The organic layer TS-IL2 is formed on the first touch insulating layer TS-IL1 to entirely cover the conductive patterns.

The organic layer TS-IL2 is formed to entirely overlap with the first insulating layer 10 and the second insulating layer 20. The organic layer TS-IL2 is formed to overlap with the first sub-area AR1-1, the second sub-area AR1-2, and the second area AR2.

The organic layer TS-IL2 is formed to cover the shock-absorbing member DM-C formed on the second area AR2. The organic layer TS-IL2 entirely covers the circuit layer DP-CL and extends from the touch sensor layer TS to cover the side surface and the upper surface of the shock-absorbing member DM-C. As described above, since the organic layer TS-IL2 covers the shock-absorbing member DM-C, which is disposed at the outermost position and causes the step difference on the base member BSM, the stress generated upon bending the display device may be relieved. Thus, fractures may be prevented from occurring in the outer portion.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
  a base member comprising a first area and a second area disposed adjacent to the first area, the first area comprises a first sub-area and a second sub-area surrounding the first sub-area;
  a circuit layer disposed on the base member to cover the first area and to expose the second area;
  a display layer disposed on the circuit layer to display an image and overlaps with the first sub-area;
  a pattern part disposed on the circuit layer and overlaps with the second sub-area;
  a thin film encapsulation layer disposed on the display layer to cover the display layer; and
  a touch sensor layer comprising a conductive pattern disposed on the thin film encapsulation layer and an organic layer to cover the conductive pattern; and
  a shock-absorbing member disposed on the second area;
  wherein the organic layer extends from an upper portion of the thin film encapsulation layer to cover an end of the thin film encapsulation layer, both of an upper surface and the side surfaces of the shock absorbing member, and at least a portion of the exposed second area.

2. The display device of claim 1, wherein the circuit layer comprises an end of the circuit layer defining a step difference in a thickness direction from an upper surface of the base member, and the end defines a boundary between the first area and the second area.

3. The display device of claim 2, wherein the organic layer covers the end of the circuit layer.

4. The display device of claim 2, wherein the circuit layer comprises:
  a plurality of conductive layers; and
  at least one insulating layer disposed between the conductive layers, and the end of the circuit layer is defined by an end of the at least one insulating layer.

5. The display device of claim 2, wherein the shock-absorbing member is disposed apart from the end of the circuit layer in a first direction, the shock-absorbing member comprises a plurality of insulating patterns, and each of the insulating patterns is disposed apart from each other along the first direction.

6. The display device of claim 5, wherein the organic layer is filled in each space between the insulating patterns.

7. The display device of claim 5, wherein each of the insulating patterns comprises a same material as the at least one insulating layer.

8. The display device of claim 5, wherein the circuit layer comprises:
  a first insulating layer; and
  a second insulating layer disposed on the first insulating layer and comprising a material different from the first insulating layer, and each of the insulating patterns comprises:
  a first layer comprising a same material as the first insulating layer; and
  a second layer comprising a same material as the second insulating layer.

9. The display device of claim 8, wherein the first layer has a same thickness as a thickness of the first insulating layer, and the second layer has a same thickness as a thickness of the second insulating layer.

10. The display device of claim 8, wherein:
  the circuit layer further comprises a plurality of conductive layers and a semiconductor layer comprising a plurality of semiconductor patterns; and
  the first insulating layer is disposed between the semiconductor layer and one conductive layer of the conductive layers.

11. The display device of claim 5, wherein the shock-absorbing member further comprises a cover member covering the insulating patterns, and the organic layer covers an upper surface and a side surface of the cover member.

12. The display device of claim 2, wherein the base member comprises:
  a base layer; and
  a buffer layer disposed between the base layer and the circuit layer, overlapped with the first area and the second area, and comprising at least one opening defined therethrough, the opening is defined in the second area to be spaced apart from the end of the circuit layer when viewed in a plan view, and the organic layer is filled in the opening.

13. The display device of claim 1, wherein an end of the thin film encapsulation layer is disposed in the first area.

14. The display device of claim 13, wherein the organic layer covers the end of the thin film encapsulation layer.

15. The display device of claim 1, wherein the touch sensor layer further comprises:
  an inorganic insulating layer disposed between the conductive patterns and the thin film encapsulation layer, and the organic layer contacts the conductive patterns and the inorganic insulating layer.

16. The display device of claim 15, wherein an end of the inorganic insulating layer is aligned parallel to the end of the thin film encapsulation layer when viewed in a cross-section.

17. The display device of claim 15, wherein the organic layer covers an end of the inorganic insulating layer.

18. The display device of claim 1, wherein the first area comprises:
- a first sub-area; and
- a second sub-area disposed adjacent to the first sub-area to surround the first sub-area, and the display layer comprises a plurality of organic light emitting devices arranged in the first sub-area.

19. The display device of claim 1, wherein:
- at least a portion of the first area is bent;
- the bent portion of the first area is disposed adjacent to the second area; and
- the organic layer covers the bent portion.

* * * * *